(12) United States Patent
Ikawa et al.

(10) Patent No.: US 7,723,846 B2
(45) Date of Patent: May 25, 2010

(54) POWER SEMICONDUCTOR MODULE AND METHOD OF MANUFACTURING THE SAME

(75) Inventors: Osamu Ikawa, Nagano (JP); Eiji Mochizuki, Nagano (JP); Masayuki Soutome, Nagano (JP); Norio Arikawa, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/224,720

(22) Filed: Sep. 12, 2005

(65) Prior Publication Data

US 2006/0060982 A1 Mar. 23, 2006

(30) Foreign Application Priority Data

Sep. 22, 2004 (JP) .............................. 2004-274427

(51) Int. Cl.
*H01L 23/12* (2006.01)
*H01L 23/495* (2006.01)
*H01L 23/48* (2006.01)
*H01L 23/14* (2006.01)
*H01L 23/10* (2006.01)
*H01L 23/34* (2006.01)
*H01L 23/52* (2006.01)
*H01L 23/40* (2006.01)
*H01L 23/498* (2006.01)
*H01L 23/31* (2006.01)

(52) U.S. Cl. .................. 257/732; 257/675; 257/698; 257/702; 257/706; 257/713; 257/718; 257/723; 257/733; 257/779; 257/E23.003; 257/E23.031; 257/E23.051; 257/E23.066; 257/E23.084; 257/E23.127; 438/123; 438/126; 438/127; 361/715; 361/736; 361/740

(58) Field of Classification Search ....................... None
See application file for complete search history.

(56) References Cited

U.S. PATENT DOCUMENTS 5,053,923 A * 10/1991 Niemetz .................. 361/709

(Continued)

FOREIGN PATENT DOCUMENTS

JP 08-236667 A 9/1996

(Continued)

OTHER PUBLICATIONS

Notification of First Office Action, dated Apr. 18, 2008, issued in corresponding CN application No. 2005101027110. (Partial English translation provided).

(Continued)

*Primary Examiner*—Andy Huynh
*Assistant Examiner*—Hoang-Quan T Ho
(74) *Attorney, Agent, or Firm*—Rossi, Kimms & McDowell LLP

(57) ABSTRACT

A power semiconductor module and a method of manufacture thereof includes a lead frame carrying lead having inner and outer lead portions. The outer lead portions, which are connected by soldering to semiconductor chips simultaneously, eliminate the need for using bonding wires. Since no bonding wire is used for connecting the leads and the semiconductor chips, a sufficient current capacity is obtained. The bonding between an insulating circuit board and the semiconductor chips and the bonding between the semiconductor chips and the leads can be made simultaneously in a single step of reflow-soldering. As a result, the mounting time can be shortened and the power semiconductor module can be manufactured more efficiently.

12 Claims, 17 Drawing Sheets

U.S. PATENT DOCUMENTS

| | | | |
|---|---|---|---|
| 5,793,106 A | 8/1998 | Yasukawa et al. | |
| 6,272,015 B1* | 8/2001 | Mangtani | 361/707 |
| 6,396,125 B1* | 5/2002 | Soyano | 257/565 |
| 6,434,008 B1* | 8/2002 | Yamada et al. | 361/728 |
| 2003/0015778 A1* | 1/2003 | Soyano et al. | 257/678 |

FOREIGN PATENT DOCUMENTS

| | | |
|---|---|---|
| JP | 09-045852 A | 2/1997 |
| JP | 10-309084 A | 11/1998 |
| JP | 2001-053222 A | 2/2001 |
| JP | 2001-110985 A | 4/2001 |
| JP | 2001-237359 A | 8/2001 |
| JP | 2002-50722 A | 2/2002 |
| JP | 2003-031764 A | 1/2003 |

OTHER PUBLICATIONS

Chinese Office Action dated Apr. 3, 2009, issued in corresponding Chinese Application No. 200510102711.0.

Japanese Office Action - Notification of Reasons for Refusal - of corresponding Japanese Patent Application No. 2004-274427 - Dated Oct. 13, 2009. (Partial Translation).

* cited by examiner

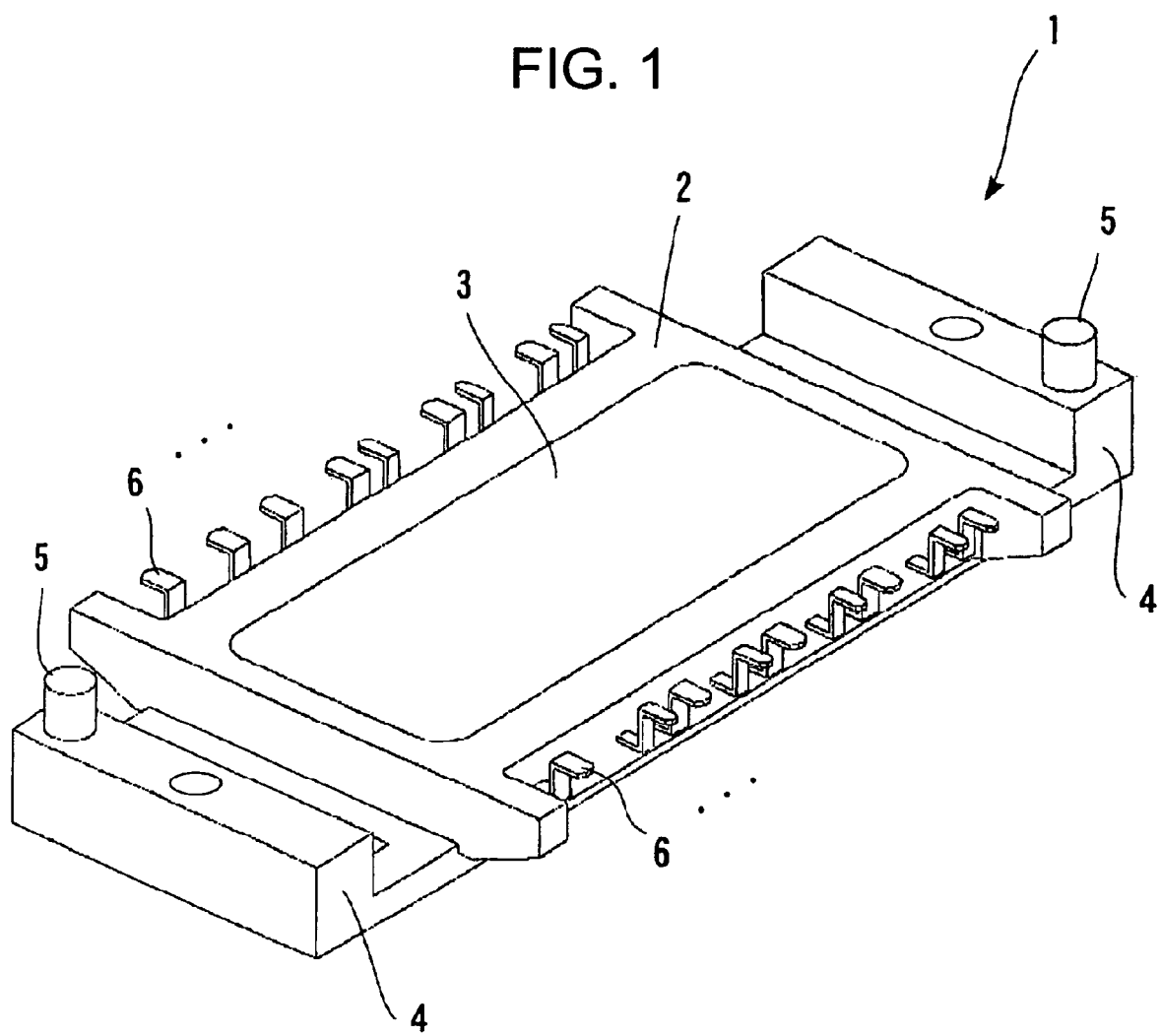

FIG. 12(A)
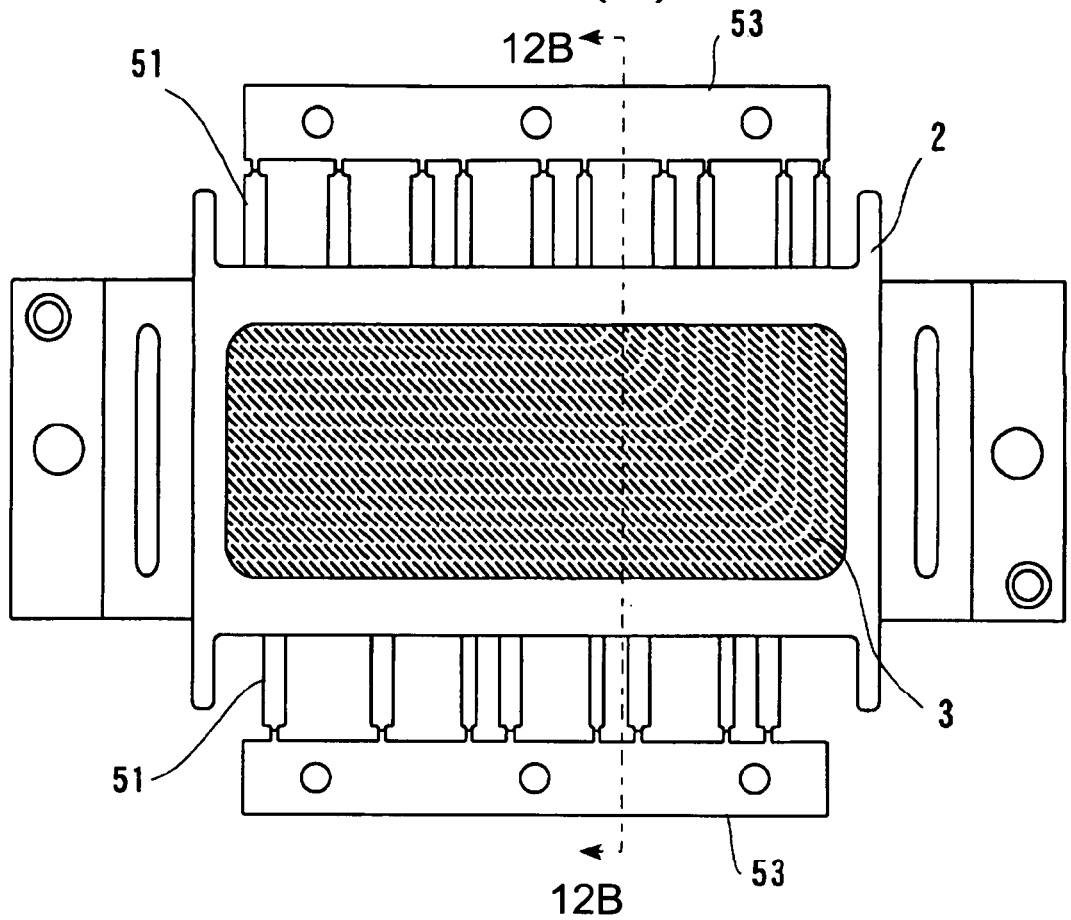
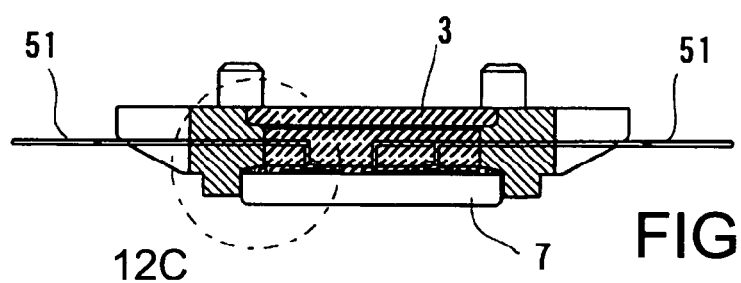
FIG. 12(B)
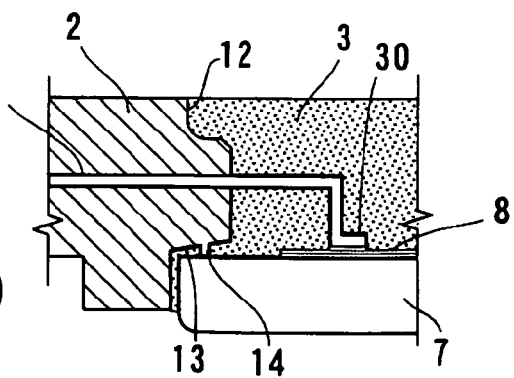
FIG. 12(C)

POWER SEMICONDUCTOR MODULE AND METHOD OF MANUFACTURING THE SAME

BACKGROUND

Power semiconductor modules are used in inverters, uninterruptive power supplies, machine tools, industrial robots, and such apparatuses in the form of packages, independent from these industrial apparatuses. Such a power semiconductor module houses therein one or more semiconductor chips insulated gate bipolar transistors (hereinafter referred to as "IGBTs") and such power semiconductor devices constituting the power converter circuit. The power semiconductor module is mounted on a predetermined control circuit board for controlling any of the apparatuses described above. See for instance JP 2002-50722 A.

The following describes such a power semiconductor module that houses a plurality of semiconductor chips. Typically, the power semiconductor module mounts the semiconductor chips on an insulating circuit board by soldering. The power semiconductor module has the leads connected to the control circuit board and the semiconductor chips by wire bonding using metal wires. Then, the power semiconductor module incorporating therein the semiconductor chips, mounted on the insulating circuit board and connected to the leads by wire bonding, is packaged by molding in a resin casing. A radiator plane arranged on the side opposite to the side of the resin casing, on which outer leads are mounted, is in contact with a cooling fin so that the heat generated in the power semiconductor devices can be dissipated to the outside.

Since the cross sectional area of the metal wires connecting the outer leads and the semiconductor chips in the power semiconductor module described above is relatively small, the module is limited in its current capacity. While a thick metal wire can improve the current capacity, it is difficult to bond the thick metal wire by ultrasonic bonding or by welding.

The manufacturing process for manufacturing the power semiconductor module includes soldering the semiconductor chip to the insulating circuit board and connecting the semiconductor chips and the outer lead portions by wire bonding. The metal wire bonding is conducted wire by wire. Since from 200 to 500 metal wires are typically used for manufacturing the power semiconductor module, it takes a long time to bond the metal wires.

Accordingly, there remains a need to provide a power semiconductor module that is manufactured more efficiently. The present invention addresses this need.

SUMMARY OF THE INVENTION

The present invention relates to a power semiconductor module that houses therein one or more semiconductor chips mounting power semiconductor devices thereon, and a method of manufacturing the same.

One aspect of the present invention is a power semiconductor module that can be mounted to a control circuit board of an electronic device. The power semiconductor module can include at least one power semiconductor device, and leads having outer lead portions that can be connected to the control circuit board of the electronic device and inner lead portions connected to the at least one semiconductor chip. The module can further include a terminal casing housing part of the leads, and an insulating circuit board housed in the terminal casing. One major surface of the insulating circuit board forms a radiator plane. The at least one semiconductor chip is mounted on the other major surface, on the side opposite to the radiator plane, of the insulating circuit board, and the inner lead portions are connected to the at least one semiconductor chip on the side opposite to the insulating circuit board.

The at least one semiconductor chip can be surface-mounted on the insulating circuit board by brazing or soldering and the inner lead portions can be surface-mounted on the at least one semiconductor chip by brazing or soldering. The at least one semiconductor chip can comprises two or more semiconductor chips, which can have an equal thickness, mounted on the insulating circuit board.

The terminal casing can comprise a main body and a pair of fastener mounting plates extending in the opposite directions from the main body thereof to facilitate fasteners into a cooling fin such that the radiator plane of the insulating circuit board can be brought into contact with the cooling fin. The radiator plane of the insulating circuit board protrudes for a predetermined length from the contact planes of the fastener mounting plates, across which the fastener mounting plates can be brought into contact with the cooling fin, to enable the radiator plane of the insulating circuit board to make contact with the cooling fin.

The terminal casing can be filled with a thermosetting resin, such as epoxy resin, that hardens for insulating sealing. The terminal casing can have cutouts formed between the fastener mounting plates and the main body of the terminal casing such that portions remaining below the cutouts are thin. Slits can be disposed in the thin portions of the fastener mounting plates. The contact plane on each of the fastener mounting plates can have a boss protruding from each of the fastener mounting plates.

The terminal casing can have at least one protrusion protruding toward the insulating circuit board in the bonding areas between the terminal casing and the insulating circuit board, to enable the thermosetting resin to flow around the at least one protrusion into a gap between the terminal casing and the insulating circuit board. The terminal casing can include an adhesion strengthening structure that strengthens the adhesion of the thermosetting resin.

The outer lead portions are adapted to be surface-mounted on the control circuit board by soldering on the side opposite to the side of the radiator plane. At least one protrusion can be formed at least on the surface that is adapted to face the control circuit board, of any of the terminal casing and the fastener mounting plates, to secure a predetermined solder thickness for soldering the outer lead portions to the control circuit board.

Each of the fastener mounting plates can include a fastener insertion hole, through which a fastener can be inserted, for fastening the power semiconductor module and the control circuit board to the cooling fin. Each of the fastener mounting plates can include a boss-shaped fastener insertion holder having the fastener insertion hole formed through the boss-shaped fastener insertion holder. The boss-shaped fastener insertion holder is insertable into an insertion hole formed in the control circuit board, to position the power semiconductor module on the control circuit board.

The portions of the leads to be soldered can include protrusions that protrude toward the solder. Polyimide layers can be formed the at least one semiconductor chip except on the electrodes thereof.

Another aspect of the present invention is a method of manufacturing the power semiconductor module described above. The method can includes the following steps: (a) providing at least one semiconductor chip; (b) providing the insulating circuit board, which can comprise an insulator layer, electrode layers constituting electrodes on one major surface of the insulator layer, and a radiator layer constituting a radiator plane on the other major surface of the insulator layer; (c) forming first solder layers on the respective electrodes; (d) mounting the at least one semiconductor chip on the first solder layers; (e) forming second solder layers on the at least one semiconductor chip; (f) stamping a predetermined metal plate to form the lead frame having leads, with the inner and outer lead portions, connected to each other via tie-bars; (g) forming a terminal casing by injection molding a resin using a predetermined molding die for housing part of the leads therein; (h) mounting the insulating circuit board on the terminal casing by bringing the inner lead portions into contact with the respective second solder layers; (i) reflowing the first and second solder layers to solder the insulating circuit board and the at least one semiconductor chip to each other and to solder the at least one semiconductor chip and the inner lead portions to each other; (j) filling the terminal casing with a hardening thermosetting resin, which can be epoxy resin, for insulating sealing; and (k) separating the outer lead portions.

The step (a) can include equalizing the two or more semiconductor chips in the thickness thereof. The step (a) can include forming polyimide layers on the at least one semiconductor chip except on the electrodes thereof and forming plating layers on the electrode surfaces thereof.

The step (c) or (e) or both steps can include dispersing core balls having a predetermined diameter into the first solder layers or the second solder layers.

The inner lead portions can be formed on the lead frame after the step (g). Insulation tests can be conducted on the leads before the step (k), and the outer lead portions that have passed the insulation tests can be identified. The step (f) can include forming the lead frame as a flat member and integrating the flat lead frame into the terminal casing, and the inner and outer lead portions can be formed by press works. The inner and outer lead portions can be formed by applying a coining work for partially shaping the portions of the lead frame to be soldered with respective protrusions protruding toward the solder.

The step (g) can include forming a pair of fastener mounting plates integrated into a main body of the terminal casing such that the fastener mounting plates extend in the opposite directions from the main body of the terminal casing, and fastening into a cooling fin through the fastener mounting plates to bring the radiator plane of the insulating circuit board into contact with the cooling fin.

The step (g) also can includes forming cutouts between the fastener mounting plates and the main body of the terminal casing such that the portions of the cutouts remaining between the fastener mounting plates and the main body of the terminal casing are thin. The step (g) also can include forming at least one protrusion protruding from the terminal casing toward the insulating circuit board in the bonding areas between the terminal casing and the insulating circuit board, integrally on the terminal casing. The step (g) also can include forming the adhesion strengthening structure integrally into the terminal casing, the adhesion strengthening structure strengthening the adhesion of the thermosetting resin.

The step (h) comprises mounting the insulating circuit board on the terminal casing such that the radiator plane of the insulating circuit board protrudes for a predetermined length from the contact planes of the fastener mounting plates, across which the fastener mounting plates are brought into contact with the cooling fin, toward the cooling fin.

The step (i) can include aligning the at least one semiconductor chip in an self-aligning manner.

The step (j) can include flowing the thermosetting resin around the at least one protrusion into the gap between the terminal casing and the insulating circuit board. The step (j) also can include making the adhesion strengthening structure hold the thermosetting resin.

BRIEF DESCRIPTION OF THE DRAWINGS

FIG. 1 schematically illustrates a perspective view of the external appearance of a first embodiment of a power semiconductor module according to the present invention.

FIG. 12(A) is a top plan view showing an epoxy resin loaded in the terminal casing.

FIG. 12(B) is a cross sectional view taken along the line segment 12B-12B of FIG. 12(A).

FIG. 12(C) is an expanded view of the area 12C of FIG. 12(B).

DETAILED DESCRIPTION

Figure 2A:
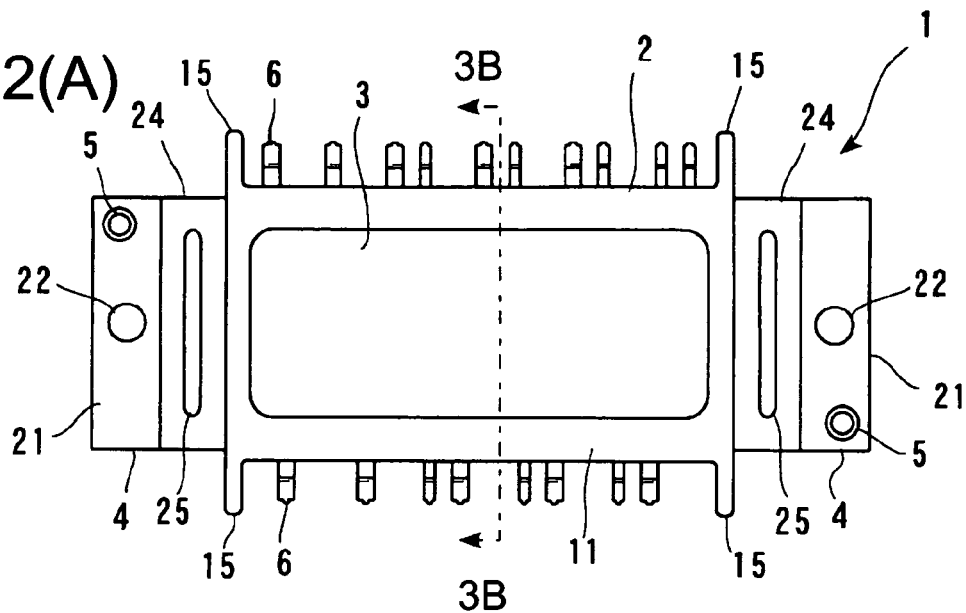
FIG. 2(A) is a top plan view of the power semiconductor module of FIG. 1.

Referring to the drawings, the present power semiconductor module is described in connection with controlling an inverter. In the following descriptions, the vertical positional relations are described sometimes with reference to the orientation of the power semiconductor module shown in FIG. 1.

Referring now to FIG. 1, a power semiconductor module 1 includes a resin terminal casing 2 housing an insulating circuit board (described later) and at least one semiconductor chip mounted on the insulating circuit board. Since the terminal casing 2 is filled and sealed with an epoxy resin (thermosetting resin) 3, the insulating circuit board and the semiconductor chips are not illustrated in FIG. 1.

Fastener mounting plates 4 for bonding the power semiconductor module 1 to a cooling fin (described later) with screw or fasteners extend from a pair of side faces on the main body of the terminal casing 2. A protrusion 5 for positioning the power semiconductor module 1 in mounting the power semiconductor module 1 to the control circuit board of an inverter is disposed on the upper surface of each fastener mounting plate 4. A plurality of outer lead portions 6, which will be connected to the control circuit board described, extend outwardly from the other pair of side faces of the terminal casing 2.

Figure 2B:
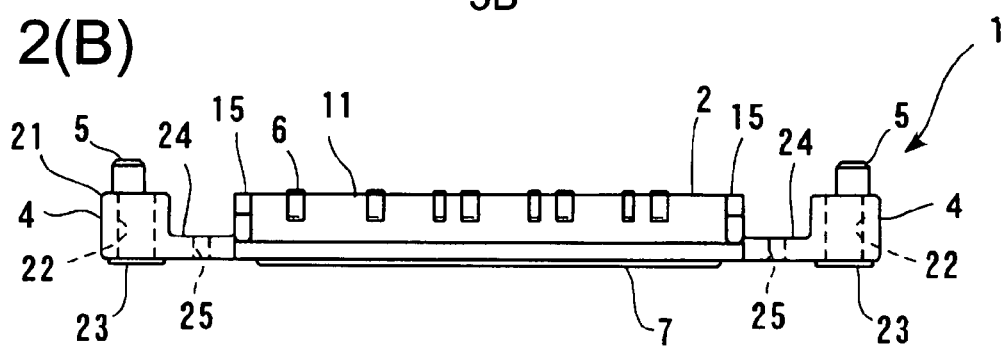
FIG. 2(B) is a front plan view of the power semiconductor module of FIG. 1.
Figure 2C:
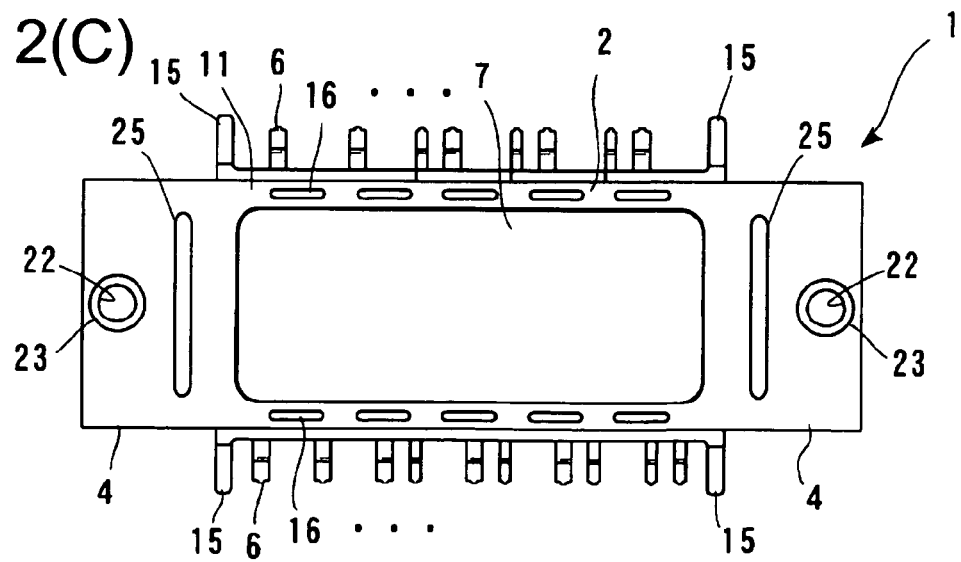
FIG. 2(C) is a bottom plan view of the power semiconductor module of FIG. 1.
Figure 3A:
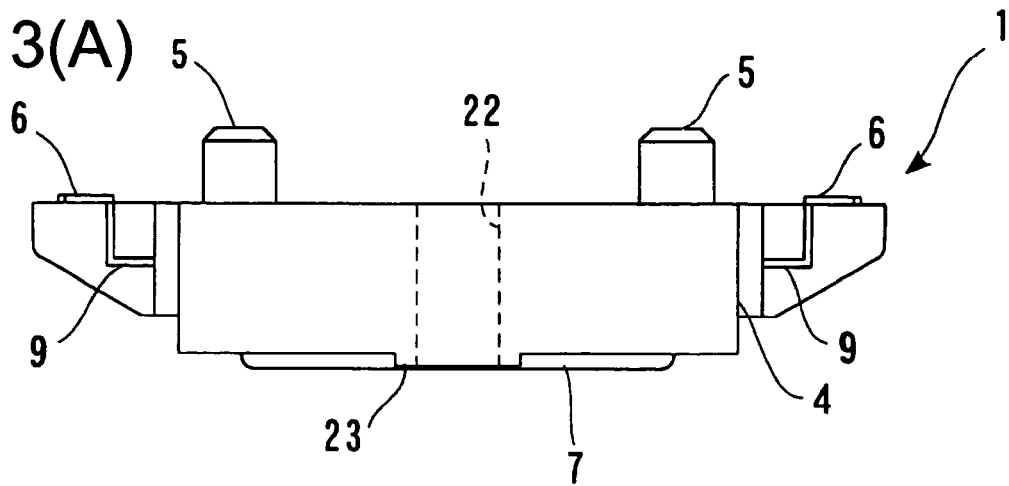
FIG. 3(A) is a side plan view of the power semiconductor module of FIG. 1.
Figure 3B:
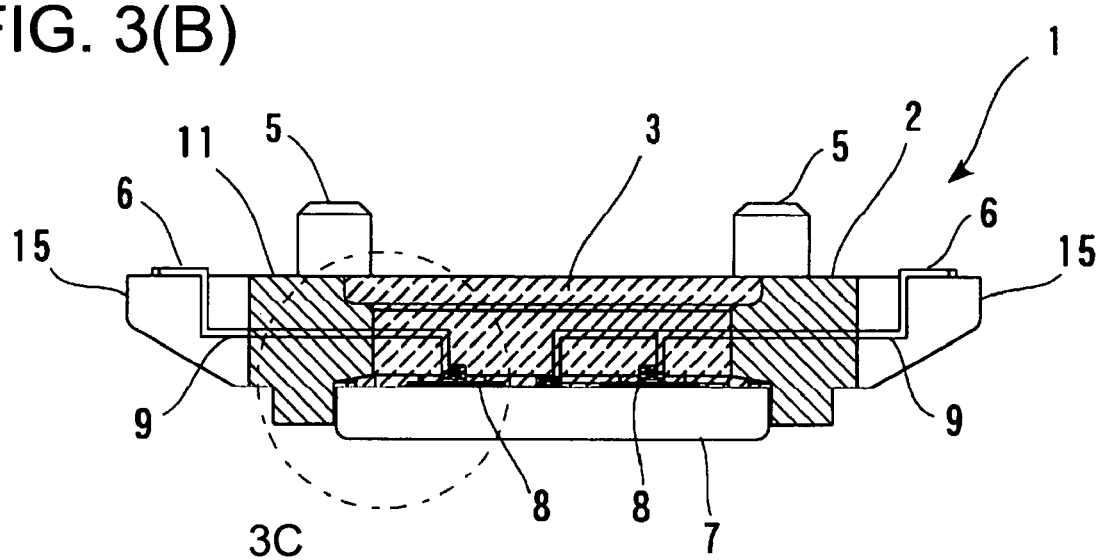
FIG. 3(B) is a cross sectional view taken along line segment 3B-3B of FIG. 2(A).

Referring to FIG. 3(B), the power semiconductor module 1 includes the terminal casing 2 housing therein an insulating circuit board 7, a plurality of semiconductor chips 8 mounted on the insulating circuit board 7, and a lead frame 9 connecting the semiconductor chips 8 to the control circuit board. The terminal casing 2 is filled and sealed with an epoxy resin 3. The outer lead portions 6 are formed of the end portions of the lead frame 9. As shown in FIGS. 2(A)-2(C), the terminal casing 2 includes a main body 11 shaped as a rectangular frame. As clearly shown in FIG. 3(C), a step 12 is formed in the upper opening of the main body 11 along the inner periphery of the rectangular frame thereof. The step 12 strengthens the adhesion of the epoxy resin 3 to the terminal casing 2 and holds the hardened epoxy resin 3. The lower opening of the main body 11 is widened such that a step 13 for housing the insulating circuit board 7 is formed. The step 13 is slanting upwardly and inwardly. Protrusions 14 protruding toward the insulating circuit board 7 are disposed in the vicinity of the four corners of the step 13. The functions of the protrusions 14 will be described later.

As clearly shown in FIG. 3(B), the frame width of the main body 11 for holding the loaded epoxy resin 3 is a little bit larger than the frame width thereof for housing the insulating circuit board 7, and the inner surface of the frame-shaped main body 11 is step-shaped in the height direction thereof. As shown in FIGS. 2(A)-2(C), a pair of flanges 15 is disposed on both end portions of each long side face of the portion in the main body 11 filled with the epoxy resin 3. The flanges 15 on one side face protrude opposite to the flanges 15 on the other side face, and perpendicularly to the longitudinal direction of the main body 11. The flanges 15 disposed as described above improve the rigidity of portion in the main body 11 filled with the epoxy resin 3. In contrast, fine trenches 16 for substantially thinning the bottom of the main body 11 are formed therein such that the rigidity of the portion in the main body 11 for housing the insulating circuit board 7 is reduced. The fastener mounting plates 4 described above extend outwardly from the end faces along the width of the portion in the main body 11 for housing the insulating circuit board 7.

A fastener insertion holder 21 for inserting a screw or fastener described later is disposed at a position of the fastener mounting plate 4 spaced part from the main body 11 of the terminal casing 2. A fastener insertion hole 22 is bored vertically in the central part of the fastener insertion holder 21. A circular boss 23 is arranged on the bottom face of the fastener mounting plate 4 such that the circular boss 23 is protruding from the bottom surface of the fastener mounting plate 4. The fastener insertion hole 22 is formed through the center of the protruding circular boss 23. The distal end face of the circular boss 23 works as a contact plane contacting with a cooling fin described later. A U-shaped cutout 24 is formed between the fastener insertion holder 21 and the main body 11 of the terminal casing 2 such that the portion of the fastener mounting plate 4 left below the cutout 24 between the fastener insertion holder 21 and the main body 11 of the terminal casing 2 (hereinafter referred to as the "bottom of the cutout 24") is thin. A long slit 25 extending in the width direction of terminal casing 2 is formed in the central part of the bottom of the cutout 24 to raise the flexibility thereof.

The insulating circuit board 7 is shaped as a rectangular plate fitting the lower inner circumference of the main body 11 of the terminal casing 2 as shown in FIGS. 2(B) and 2(C). As clearly shown in FIG. 3(C), the insulating circuit board 7 includes a main substrate 26 made of aluminum or copper, an insulator resin layer 27 made of an epoxy resin containing a filler exhibiting an excellent thermal conductivity (such as aluminum nitride powder and silicon dioxide powder), and copper foil patterns 28 printed on the insulator resin layer 27. The semiconductor chip 8 is surface-mounted on the copper foil via a solder layer 29. A narrow gap is formed between the insulating circuit board 7 and the main body 11 of the terminal casing 2 so that the insulating circuit board 7 can be held stably inside the main body 11 with the epoxy resin 3 filling the gap. As clearly shown in FIG. 3(A), the lower surface of the insulating circuit board 7 is exposed below the terminal casing 2 such that a radiator plane is formed. The radiator plane of the insulating circuit board 7 protrudes downwardly for a certain length from the distal end faces of the circular bosses 23.

The lead frame 9 is a long copper plate molded to the main body 11 of the terminal casing 2 such that the lead frame 9 extends parallel to the main body 11 of the terminal casing 2. One end of the lead frame 9 extends outwardly from the main body 11 such that an outer lead portion 6, the longitudinal cross section thereof having an L shape, is formed, and the other end of the lead frame 9 extends into the main body 11 such that an inner lead portion 30, the longitudinal cross section thereof also having an L-shape, is formed. The end portion of the outer lead portion 6 is almost on the same plane with the upper surface of the main body 11 and extends parallel to the upper surface of the main body 11. The end portion of the outer lead portion 6 is bonded by soldering to the control circuit board of an inverter described later. The end portion of the inner lead portion 30 extends parallel to the upper surface of the semiconductor chip 8 and connects to the electrode of the semiconductor chip 8 via a solder layer 31.

Figure 4:
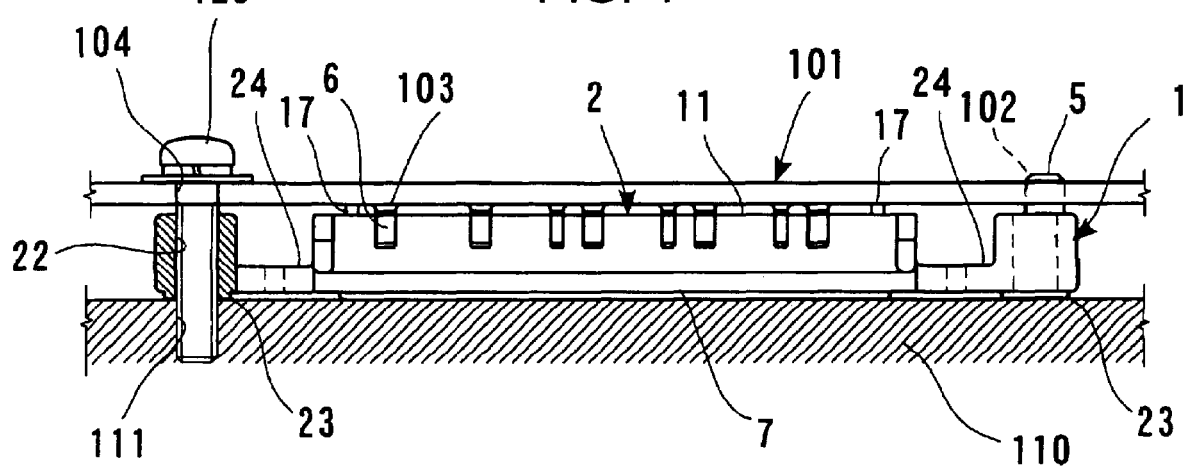
FIG. 4 is a cross sectional view of the power semiconductor module of FIG.1 mounted on the control circuit board of an inverter.

The power semiconductor module 1 configured as described above can be mounted on the control circuit board of an inverter and a cooling fin is attached to the power semiconductor module 1. Referring to FIG. 4, which shows a partial cross sectional view, in mounting the power semiconductor module 1 on a control circuit board 101, the power semiconductor module 1 is set at a predetermined position of the control circuit board 101 by inserting the positioning protrusions 5 on the power semiconductor module 1 into positioning holes 102 formed through the control circuit board 101. Solder layers 103 are formed by screen printing in advance at the positions corresponding to the outer lead portion 6 of the power semiconductor module 1. In setting the power semiconductor module 1, the outer lead portions 6 are placed on the solder layers 103. The fastener insertion holes 22 of the power semiconductor module 1 are placed at the positions corresponding to insertion holes 104 formed in advance through the control circuit board 101. In this state, reflow-soldering is conducted to bond the power semiconductor module 1 to the control circuit board 101. Small protrusions 17 can be formed near the four corners on the upper surface of the main body 11 of the terminal casing 2 to secure a certain solder layer thickness at the time when the solder layers are made to reflow.

The unit, in which the power semiconductor module 1 and the control circuit board 101 are combined, is mounted on a cooling fin 110, the upper surface thereof is flat. A fastener hole 111 is formed at the position of the cooling fin 110 corresponding to the fastener insertion hole 22 of the power semiconductor module 1. The unit combining the power semiconductor module 1 and the control circuit board 101 therein is fixed to the cooling fin 110 by inserting a screw or fastener 120 from the side of the control circuit board 101 into the fastener insertion holes 104 and 22 and by fastening the fastener 120 into the fastener hole 111. Since the radiator plane of the insulating circuit board 7 protrudes downward for a certain length from the distal end faces of the circular bosses 23 as described earlier, the bottoms of the cutouts 24 are bent by the fastening due to the height difference. Since the radiator plane of the insulating circuit board 7 is pressed strongly to the cooling fin 110, excellent heat conduction is obtained between the insulating circuit board 7 and the cooling fin 110. Therefore, sufficient heat radiation effects are obtained.

Figure 5:
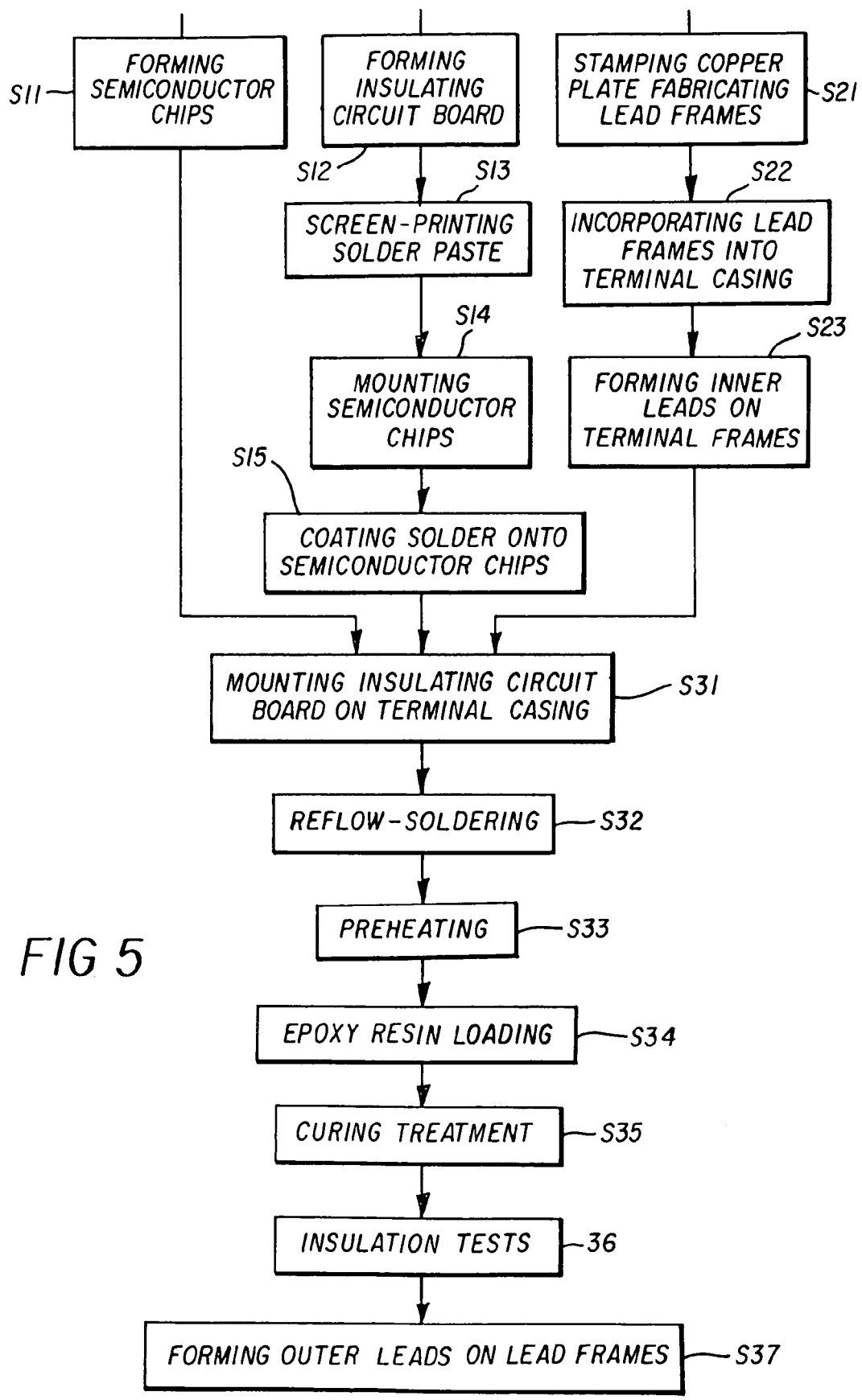
FIG. 5 is a flow chart describing the manufacturing steps of the first embodiment.

Now the method for manufacturing the power semiconductor module will be described in detail below. FIG. 5 is a flow chart describing the steps for manufacturing the power semiconductor module according to the first embodiment. FIGS. 6(A)-14 illustrate the manufacturing steps. In the following, the manufacturing process is described in the descending order of the step numbers (S11 through S37) described in FIG. 5.

First, semiconductor chips 8 are formed (step S11). See FIG. 6(A)-6(B). In detail, IGBTs, free-wheel diodes (FWDs) and such power semiconductor devices are formed on a predetermined semiconductor substrate. Polyimide layers 42 are formed on the surfaces of the power semiconductor devices except the electrode surfaces thereof. Nickel (Ni) plating layers 43 are formed on the respective electrodes of the power semiconductor devices by electroless plating. Gold (Au) plating layers 44 are formed on the Ni plating layers 43 by electroless plating. Then, the semiconductor substrate is diced into chips 41. The plating treatments described above are conducted to improve the wetness of the solder, since the electrodes of the power semiconductor devices are aluminum layers. The plating treatments make the surfaces of the polyimide layers 42 repel the solder and make the solder adhere accurately to the electrodes as far as the amount of the solder coated later is appropriate.

Figure 3C:
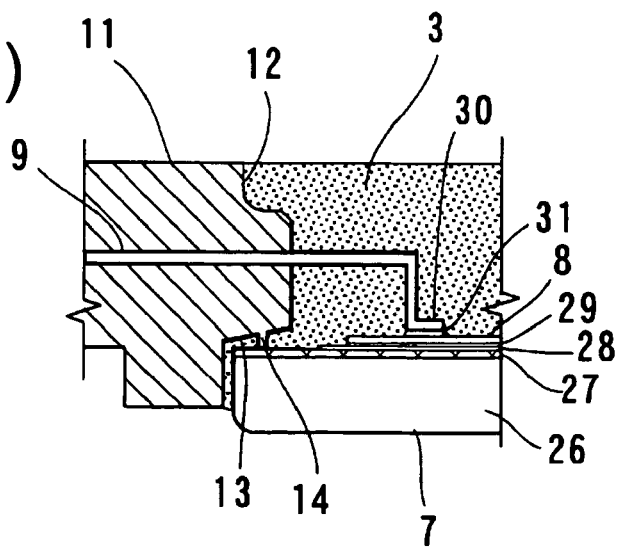
FIG. 3(C) is an expanded view of the area 3C of FIG. 3(B).
Figure 7A:
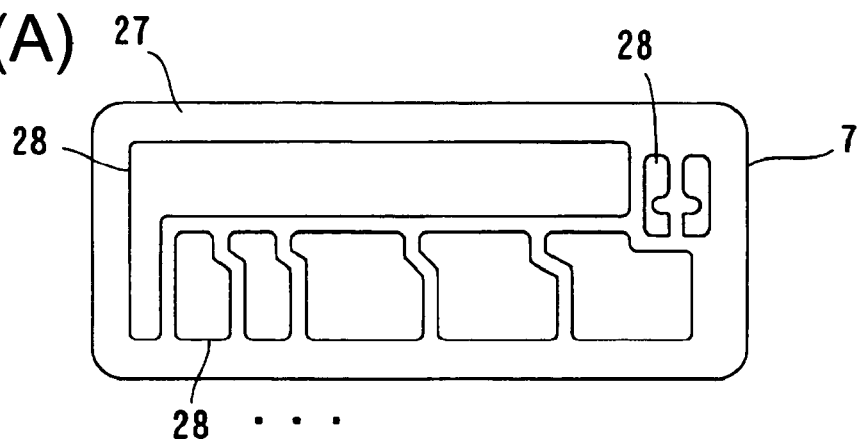
FIG. 7(A) shows an insulator resin layer and copper foil patterns formed on an insulating circuit main board.

An insulating circuit board 7 can be formed (step S12) at the same time as the formation of the semiconductor chips 8. As shown in FIG. 3(C), an insulator resin layer 27 made of an epoxy resin containing a filler exhibiting an excellent thermal conductivity (such as aluminum nitride powder and silicon dioxide power) is formed on a main substrate 26 made of aluminum or copper. Then, copper foil patterns 28 constituting the electrodes can be formed on the insulator resin layer 27 as shown in FIG. 7(A).

Figure 7B:
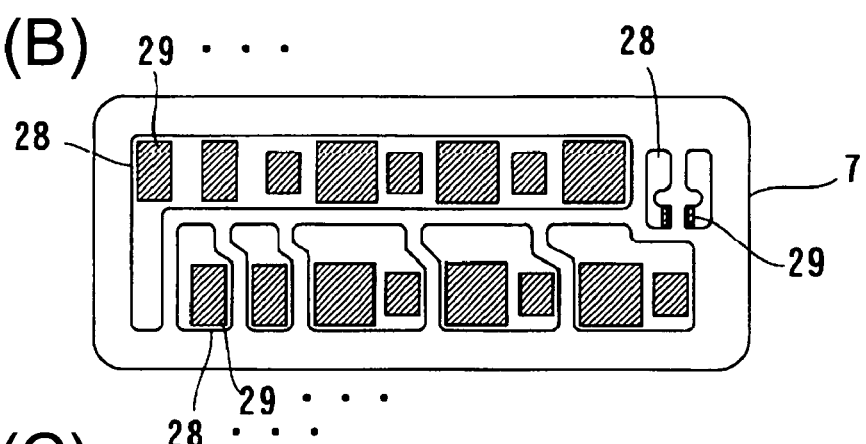
FIG. 7(B) shows first solder layers printed on the copper foil patterns of FIG. 7(A).
Figure 7C:
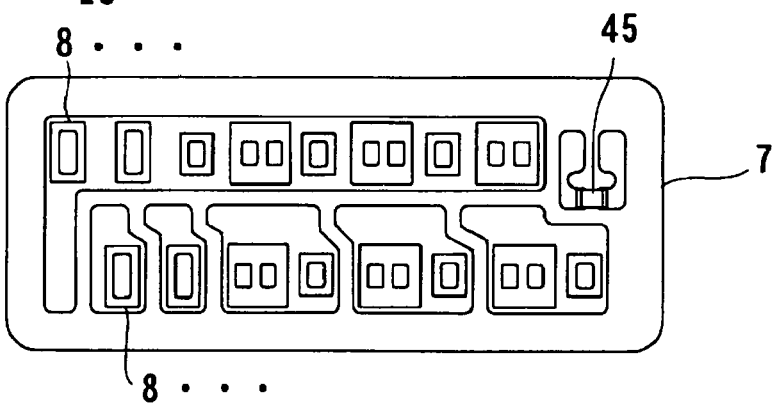
FIG. 7(C) shows semiconductor chips mounted on the first solder layers of FIG. 7(B).
Figure 7D:
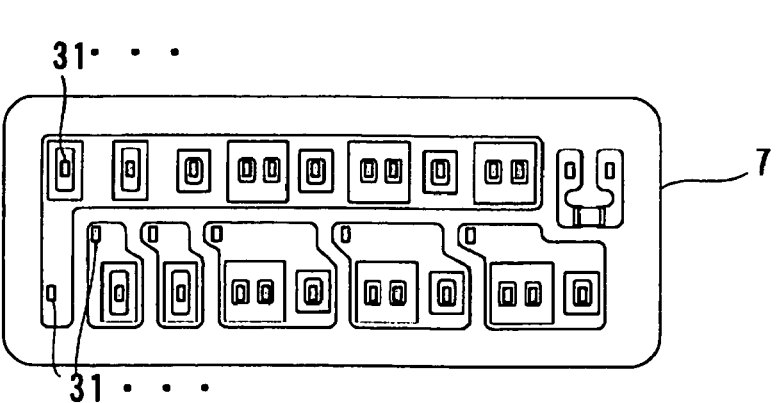
FIG. 7(D) shows second solder layers coated on the semiconductor chips and the copper foil patterns.

Then, solder layers 29 (first solder layers) are printed at the predetermined positions on the patterns 28 by screen printing as shown in FIG. 7(B) (step S13). Then, the semiconductor chips 8 are mounted on the respective solder layers 29 as shown in FIG. 7(C) (step S14). Further, a thermistor 45 for temperature detection can be mounted on the solder layer. Then, solder layers 31 (second solder layers) can be coated with a dispenser at the predetermined positions on the semiconductor chips 8 and at the predetermined positions on the patterns 28 as shown in FIG. 7(D) (step S15).

Figure 8A:
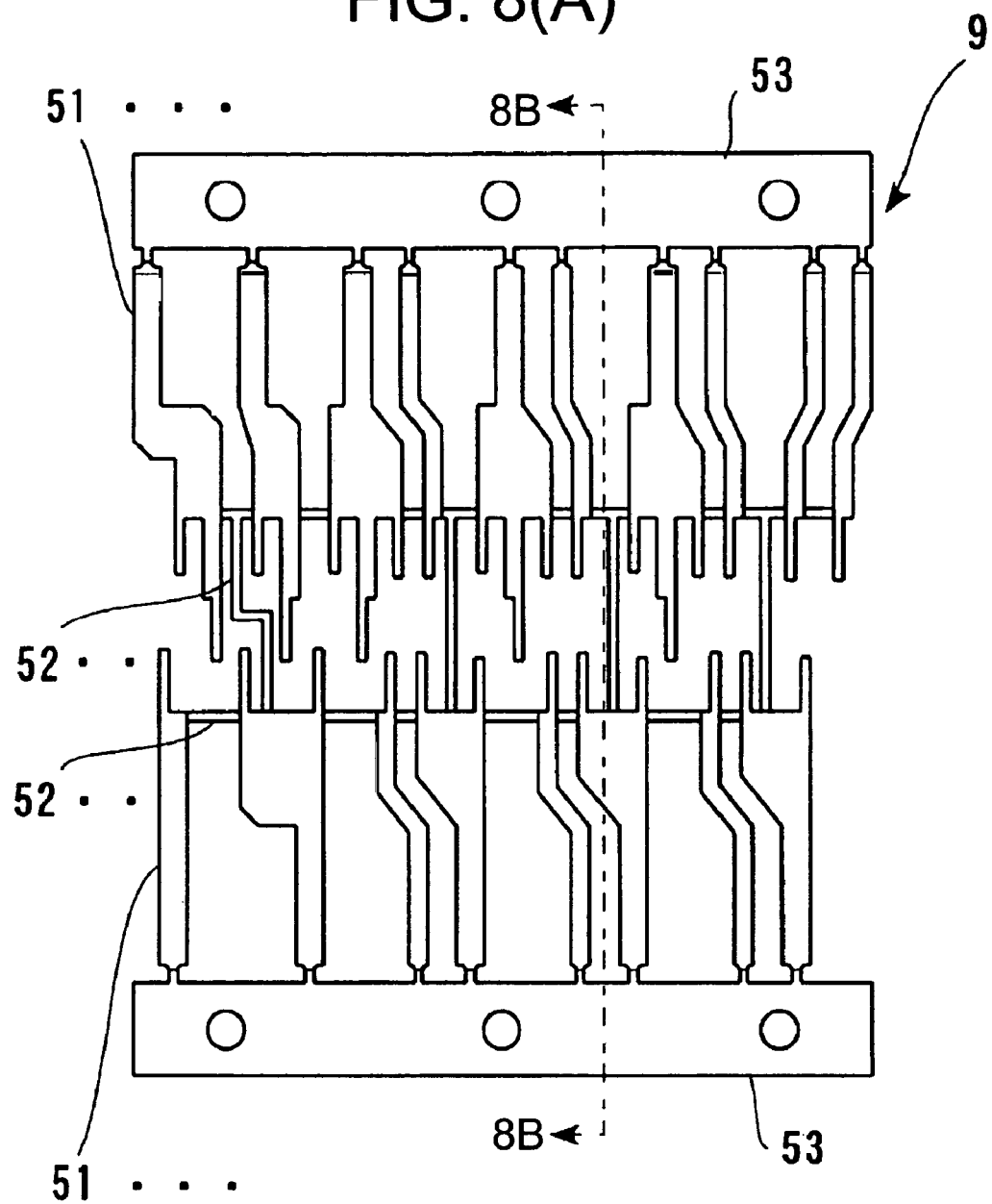
FIG. 8(A) shows a lead frame punched out from a rectangular copper plate by press working.
Figure 8B:
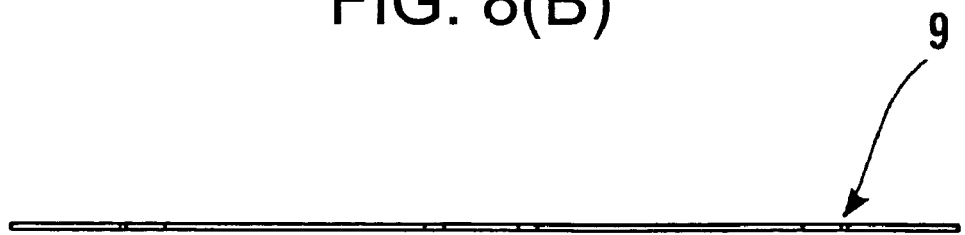
FIG. 8(B) is a cross sectional view taken along line segment 8B-8B of FIG. 8(A).

Independently of the steps described above, the terminal casing 2 and such parts can be formed. In detail, the lead frame 9 shown in FIG. 8(A) can be formed by stamping a predetermined rectangular copper plate by press work (step S21). In the lead frame 9, leads 51 can be connected by tie-bars such that the lead frame 9 remains flat as shown in FIG. 8(B). The adjacent leads can be connected by tie-bars 52 on the inner lead side thereof and by tie-bars 53 on the outer lead side thereof such that the adjacent leads are short-circuited.

Figure 9A:
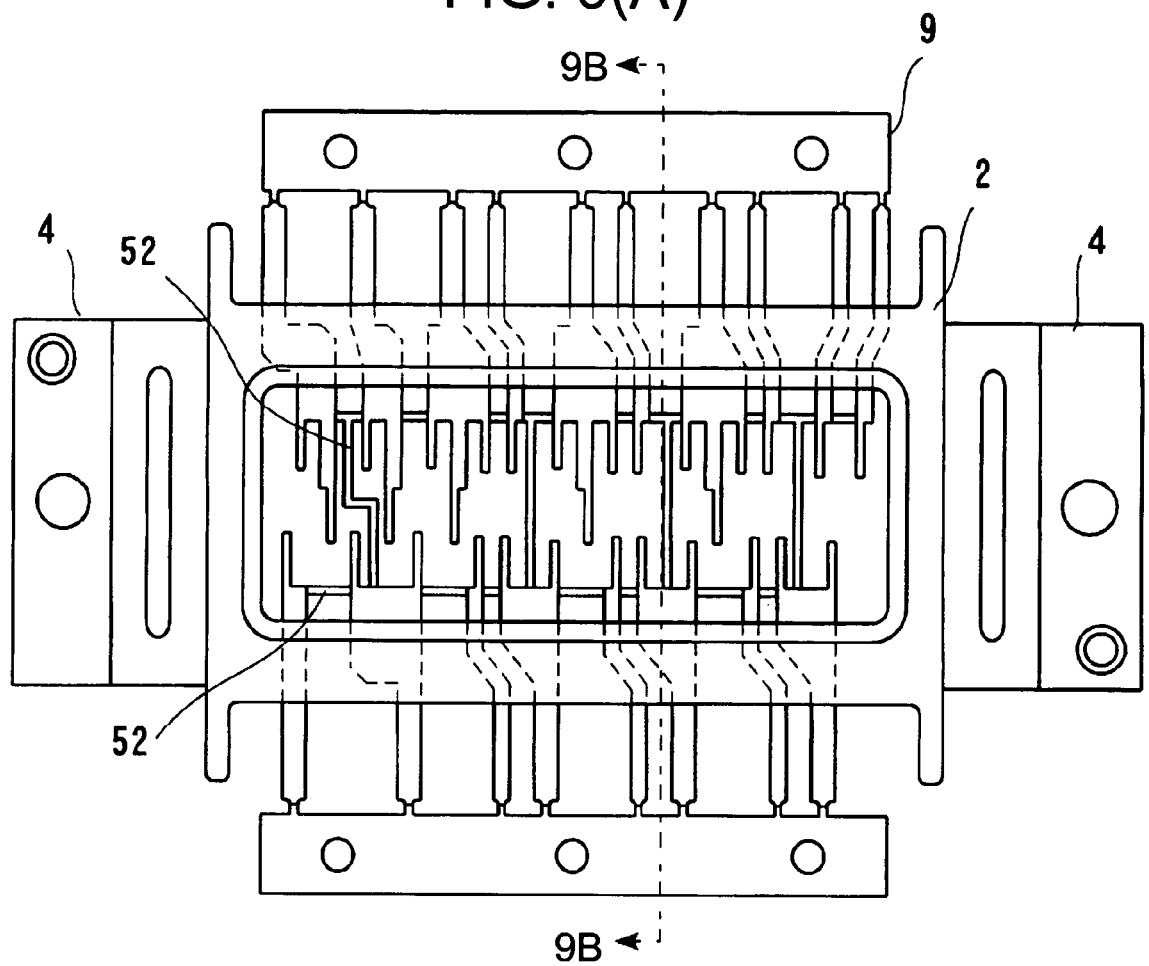
FIG. 9(A) is a top plan view showing a terminal casing incorporating the lead frames therein.
Figure 9B:
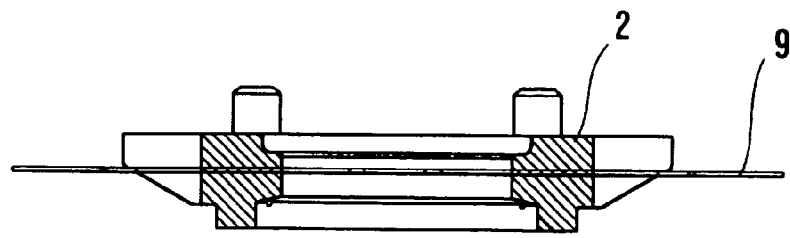
FIG. 9(B) is a cross sectional view taken along the line segment 9B-9B of FIG. 9(A).

Then, the lead frame 9 can be set in a predetermined die and the terminal casing 2 incorporating the lead frame 9 therein as shown in FIG. 9(A) can be formed by injection molding of a polyphenylene sulfide resin (hereinafter referred to as a "PPS resin") (step S22). Protrusions 14 and the step 12 shown in FIG. 3(C) can be formed on the terminal casing 2 by injection molding. The fastener mounting plates 4 also can be formed by injection molding such that the fastener mounting plates 4 are integrated into the terminal casing. In this state, the lead frame 9 still remains flat as shown in FIG. 9(B). For improving the adhesiveness of the PPS resin to the epoxy resin, a predetermined amount of a phenoxy resin or an ester may be added to the PPS resin.

Figure 10A:
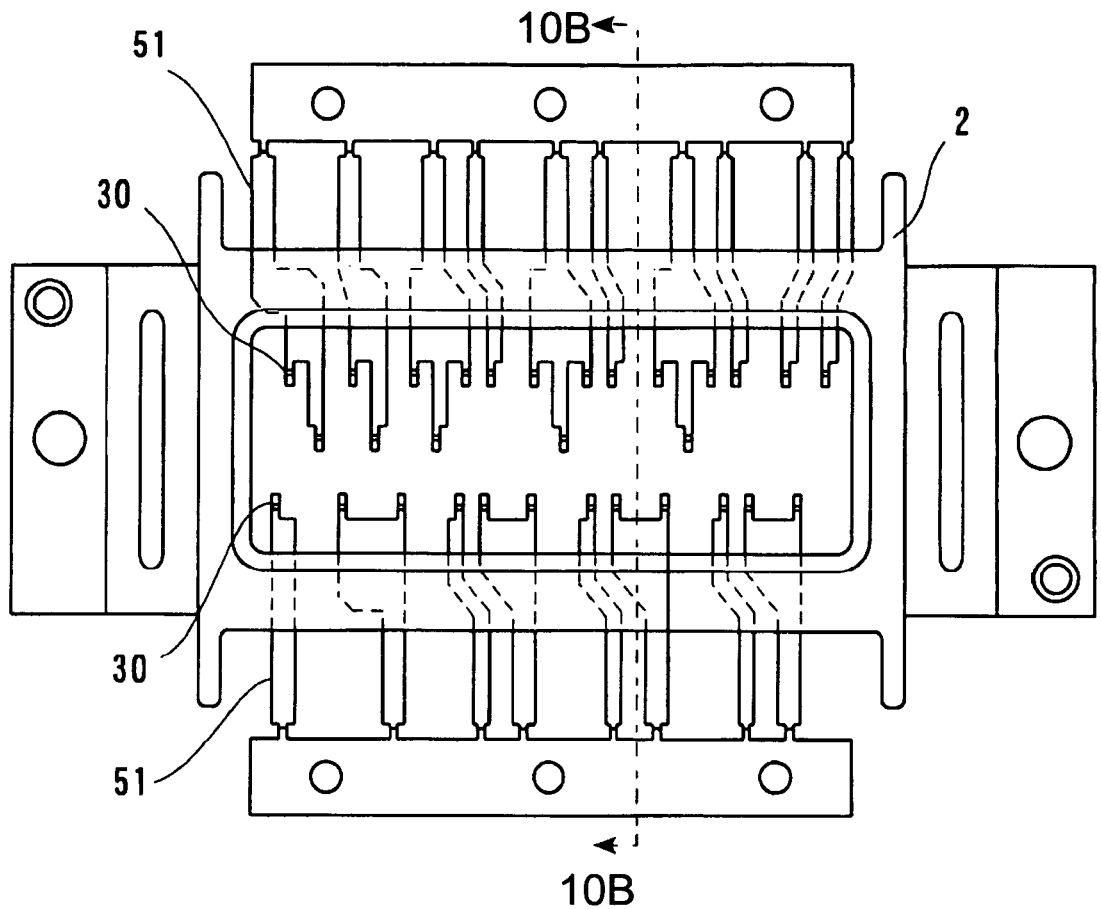
FIG. 10(A) is a top plan view showing the inner lead portions formed on the lead frame.
Figure 10B:
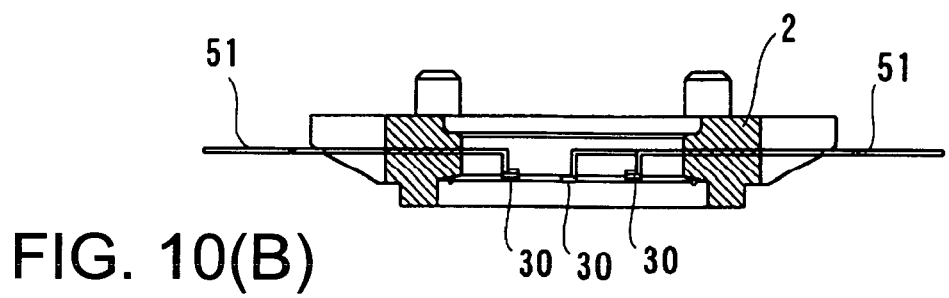
FIG. 10(B) is a cross sectional view taken along the line segment 10B-10B of FIG. 10(A).
Figure 10C:
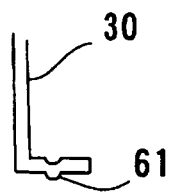
FIG. 10(C) is a longitudinal cross section of the inner lead including a small protrusion formed in the central part of the end portion thereof.

Then, the tie-bars 52 on the inner lead side of the lead frame 9 can be cut off and the inner lead portions 30 can be formed as shown in FIGS. 10(A) and 10(B) by pressing the inner lead side of the lead frame 9 perpendicularly to the plane thereof (step S23). At the same time, a protrusion 61 protruding downwardly can be formed in the central part of the end portion of the inner lead portion 30 as shown in FIG. 10(C) by the coining work applied to the inner lead portion 30.

Figure 11A:
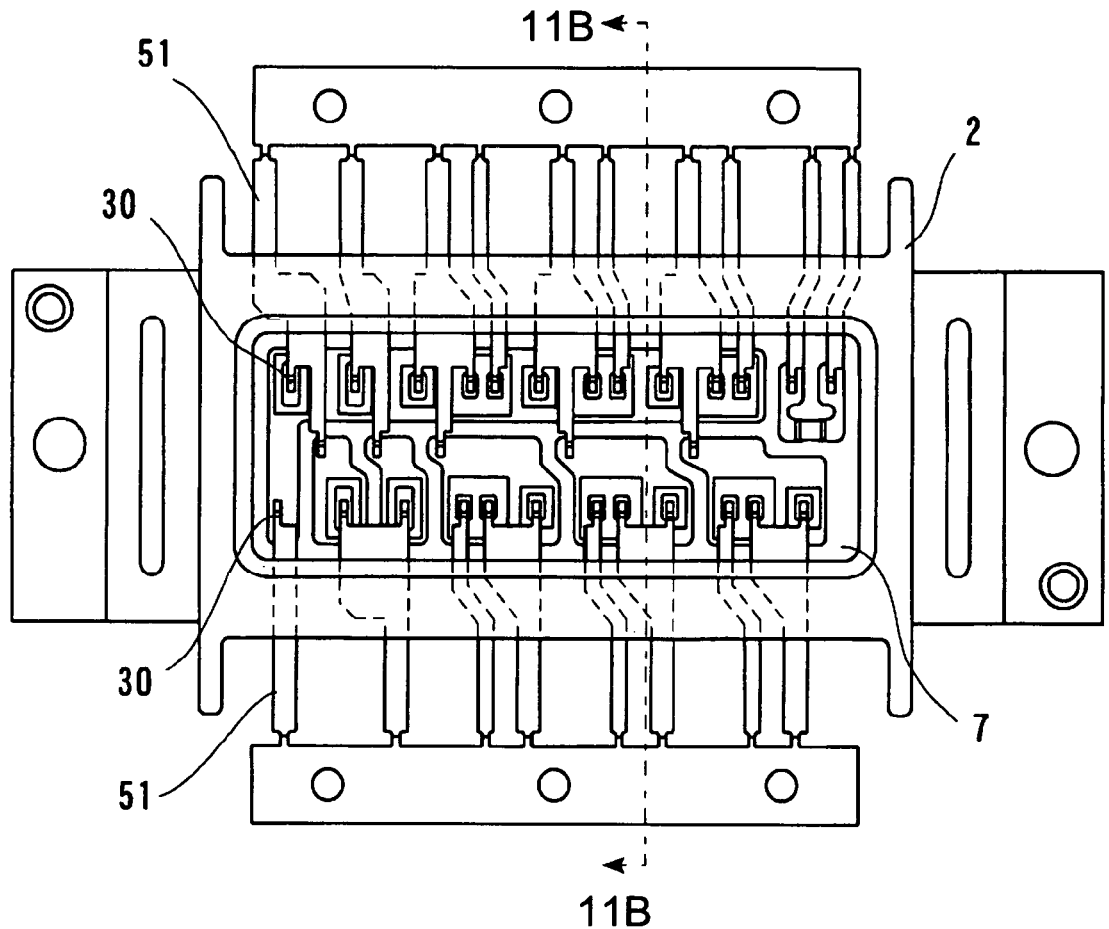
FIG. 11(A) is a top plan view showing an insulating circuit board mounted on the terminal casing.
Figure 11B:
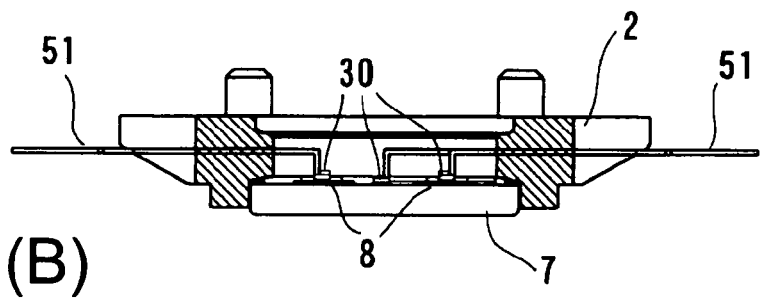
FIG. 11(B) is a cross sectional view taken along line segment 11B-11B of FIG. 11(A).
Figure 11C:
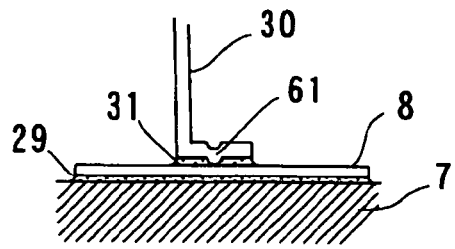
FIG. 11(C) a cross sectional view showing the inner lead brought into contact with the second solder layer.

Then, the insulating circuit board 7 can be mounted on the terminal casing 2 as shown in FIGS. 11(A) and 11(B), and the inner lead portions 30 of the leads 51 can be brought into contact with the solder layer 31 as shown in FIG. 11(C) (step S31). At this stage, the radiator plane of the insulating circuit board 7 protrudes downwardly for a certain length from the distal end faces of the circular bosses 23 of the fastener mounting plates 4 as described above. Then, reflow-soldering is conducted in this state (step S32). In detail, the first and second solder layers 29 and 31 are made to reflow simultaneously, and the semiconductor chips 8 are soldered to the insulating circuit board 7 and the inner lead portions 30 simultaneously. The solder layers, repelled by the polyimide layers, move to the positions between the inner lead portions 30 and the electrodes of the semiconductor chips 8 by self alignment. As a result, the semiconductor chips 8 also move in an self-aligning manner and become bonded at the respective centered or correct positions. Since the necessary solder thickness is secured between the inner lead portions 30 and the semiconductor chips 8 by the protrusions 61 on the inner lead portions 30 as shown in FIG. 11(C), a sufficient solder bonding strength is obtained.

Then, preheating is conducted (step S33) and molten epoxy resin 3 is loaded into the terminal casing 2 as shown in FIGS. 12(A) and 12(B) (step S34). As shown in FIG. 12(C), the epoxy resin 3 is loaded through the gap formed by the protrusions 14 between the terminal casing 2 and the insulating circuit board 7. The epoxy resin 3 filling the terminal casing 2 is hardened in a curing furnace (step S35). The epoxy resin 3 is held stably by the step 12 of the terminal casing 2. For preventing the epoxy resin 3 from peeling off the semiconductor chips 8 or the lead frame 9, it is preferable to select an epoxy resin exhibiting a thermal expansion coefficient substantially the same as those of the semiconductor chips 8 and the lead frame 9.

Figure 13A:
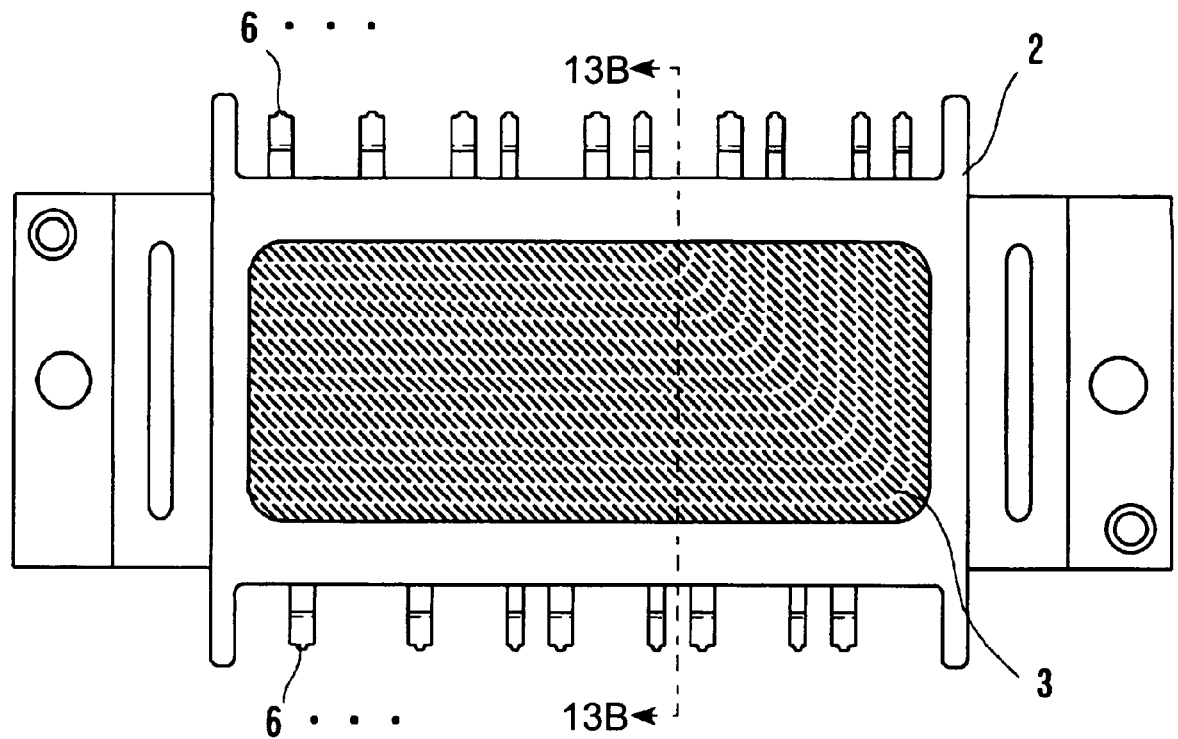
FIG. 13(A) is a top plan view showing the outer leads separated from each other.
Figure 13B:
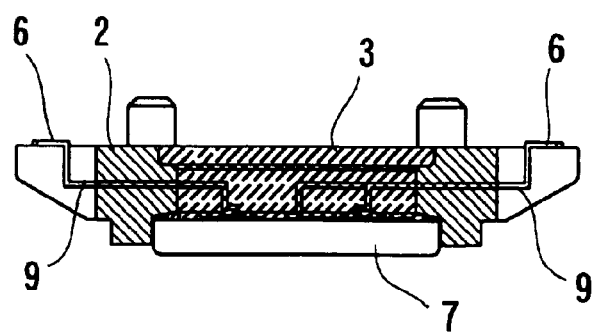
FIG. 13(B) is a cross sectional view taken along the line segment 13B-13B of FIG. 13(A).

In this state, insulation tests are conducted by feeding current to a pair of tie-bars 53 (step S36). Then, the outer lead portions 6 are formed, as shown in FIGS. 13(A) and 13(B), by pressing the outer-lead-side portions of the leads 51, which have passed the insulation tests, perpendicularly to the plane of the leads 51 to cut off the tie-bars 53 such that leads 51 become separated from each other (step S37). Although the invention has been described in connection with the terminal casing 2 of a DIP-type, one that extends the outer lead portions 6 from the both side faces thereof, the terminal casing may be an SIP-type, one that extends the outer lead portions from one side face thereof, or a QFP-type, one that extends the outer lead portions from the upper surface thereof. The package thus can have any of the different outer lead portion configurations.

As described above, the lead frame 9 in the power semiconductor module 1 according to the first embodiment have the inner lead portions 30 and the outer lead portions 6. The outer lead portions 6 are bonded to the semiconductor chips 8 simultaneously by soldering. Therefore, the number of the constituent parts is reduced as compared with bonding the outer lead portions and the semiconductor chips via bonding wires. Since it is not necessary to bond the outer lead portions to the semiconductor chip one by one, the power semiconductor module 1 is obtained efficiently. Since the outer lead portions and the semiconductor chips are not connected by bonding wires, a sufficient current capacity is secured.

Wire bonding is not employed in manufacturing the power semiconductor module 1 according to the present invention. The bonding between the insulating circuit board 7 and the semiconductor chips 8 and the bonding between the semiconductor chips 8 and the lead frame 9 are conducted simultaneously through one step of reflow-soldering. Therefore, the time for mounting is shortened extremely and a power semiconductor module is manufactured very efficiently.

An aluminum insulating board including the aluminum main substrate 26 and the insulator resin layer 27 formed on the aluminum main substrate 26 as shown in FIGS. 3(A) through 3(C) is used for the insulating circuit board 7 in the first embodiment. Alternatively, a direct-copper-bond (DCB) insulating board can be used instead of the aluminum insulating board with no problem.

Figure 14:
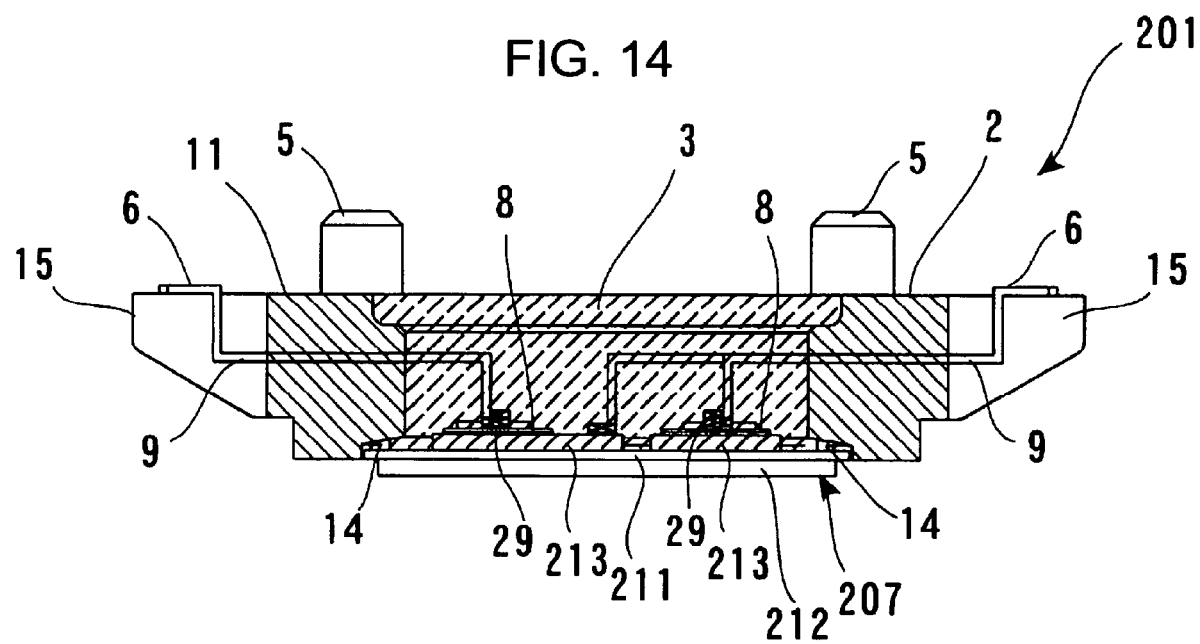
FIG. 14 schematically illustrates a cross sectional view of a second embodiment of the power semiconductor module that employs a DCB insulating circuit board.

Referring to FIG. 14, the second embodiment of the power semiconductor module 201 mounts thereon an insulating circuit board 207 including an insulating ceramic substrate 211 made of aluminum oxide ($AL_2O_3$), aluminum nitride (AlN), silicon nitride (SiN), and such ceramics. A radiator plane 212 can be formed on the lower surface of the insulating ceramic substrate 211 by laminating copper foils thereon. Copper foil patterns 213 can be formed on the upper surface of the insulating ceramic substrate 211. Semiconductor chips 8 can be surface-mounted on the copper foil patterns 213 via the solder layers 29. The protrusions 14 on the terminal casing 2 can be brought into contact with the ceramic substrate 211.

Figure 6A:
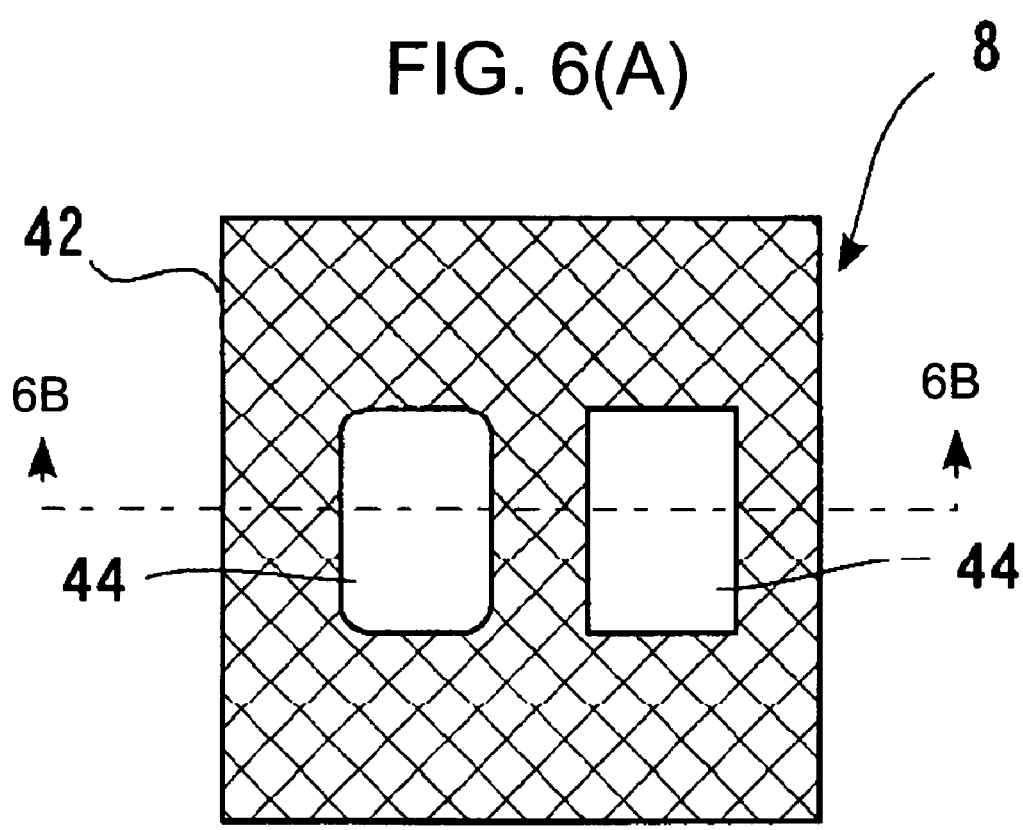
FIG. 6(A) is a top plan view of a semiconductor chip.
Figure 6B:
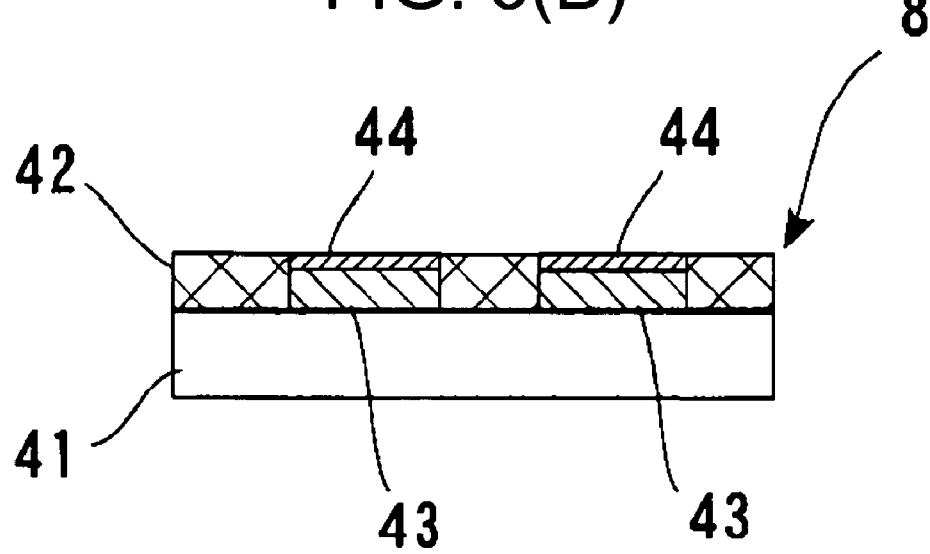
FIG. 6(B) is a cross sectional view taken along line segment 6B-6B of FIG. 6(A).

The Ni plating layers 43 and the Au plating layers 44 can be formed on the electrodes of the power semiconductor chips 8 by electroless plating to improve the solder wetness as in the second embodiment, as described with reference to FIGS. 6(A) and 6(B). Alternatively, the Ni layers and the Au layers can be formed by other techniques. For example, plasma CVD, vapor deposition, sputtering and such film deposition methods can be used in substitution for the electroless plating. Stannic (Sn) layers can be deposited instead of the Ni layers.

Figure 15:
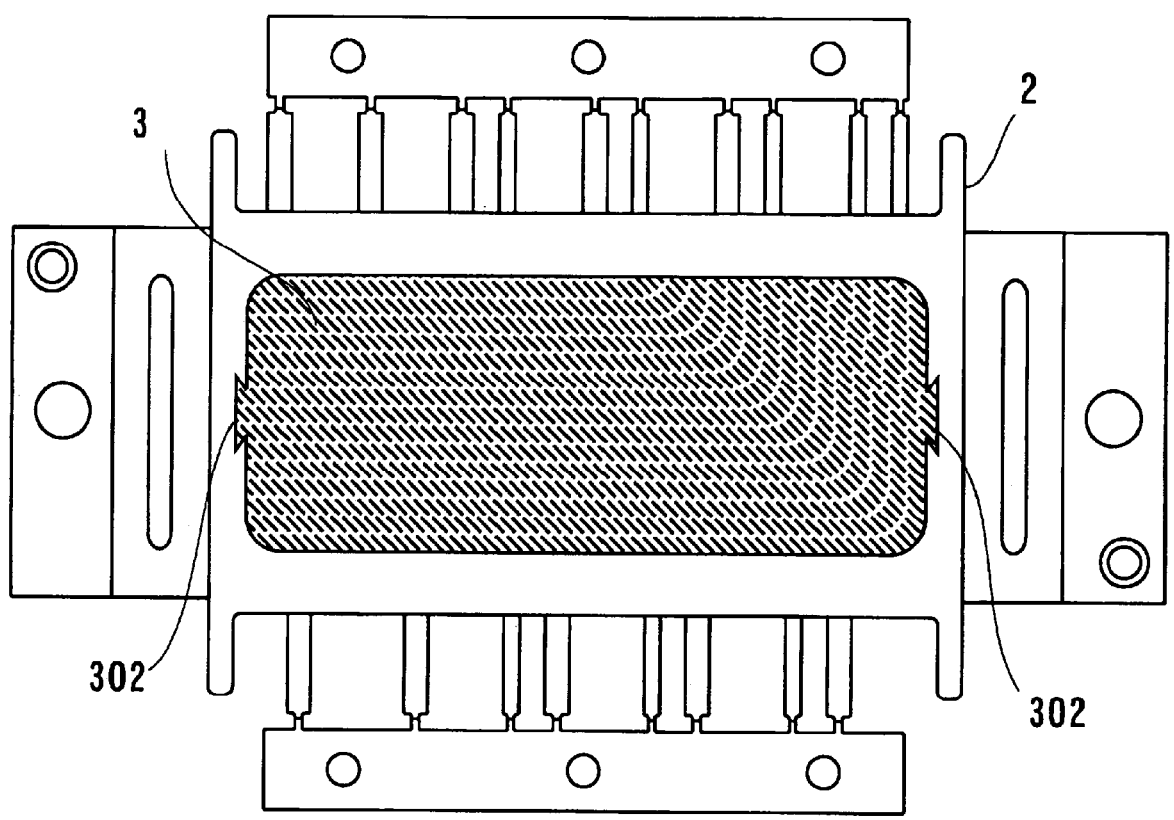
FIG. 15 is a top plan view showing the epoxy resin hooked on the terminal casing by the sharp cutouts formed in the terminal casing.

The step 12 can be formed on the upper part in the terminal casing 2 to strengthen the adhesion of the epoxy resin 3 to the terminal casing 2 as in the first embodiment, as shown in FIGS. 3(B) and 3(C). Alternatively, a structure that facilitates hooking the epoxy resin 3 can be employed. The epoxy resin 3 can be adhered tightly to the terminal casing 2, for example, by sharp cutouts 302 formed in the upper parts on the inner circumference of the terminal casing 2 as shown in FIG. 15.

Figure 16A:
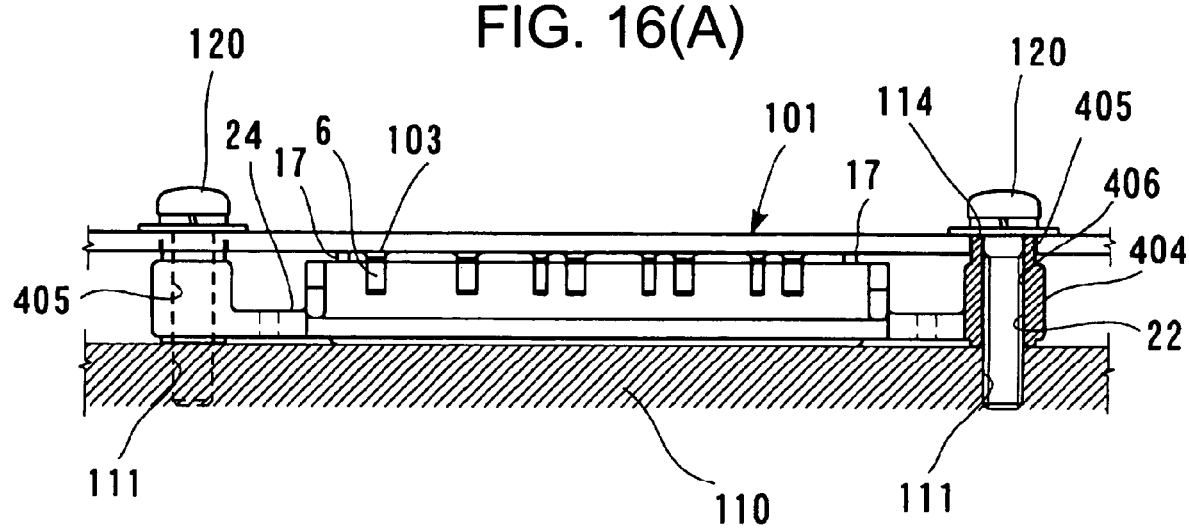
FIG. 16(A) is a cross sectional view showing a boss-shaped first fastener insertion holder and a fastener insertion hole formed through the first fastener insertion holder for securing both the power semiconductor module and the control circuit board to the cooling fin.

The power semiconductor module 1 can be mounted on the control circuit board 101 as shown in FIG. 4 of the first embodiment. Alternatively, the power semiconductor module 1 can be mounted on the control circuit board 101 in the modified manner as shown in FIGS. 16(A)-17(B). A boss-shaped fastener insertion hold 405 as shown in FIG. 16(A) can be disposed for positioning the power semiconductor module to the control circuit board 101. The fastener insertion holder 405 is disposed on a fastener mounting plate 404 of the power semiconductor module such that the fastener insertion holder 405 protrudes upwardly. The power semiconductor module is positioned on the control circuit board by inserting the fastener insertion holder 405 into an insertion hole 114 formed in the control circuit board. A fastener insertion hole 406 for fastening the power semiconductor module and the control circuit board 101 to the cooling fin 110 is formed through the fastener insertion holder 405. The fastener insertion hole 406 works also for the fastener insertion hole 22 described earlier. The power semiconductor module 1 and the control circuit board 101 are fixed to the cooling fin 110 by fastening the fastener 120 through the insertion hole 406 into the fastener hole 111 of the cooling fin 110.

Figure 16B:
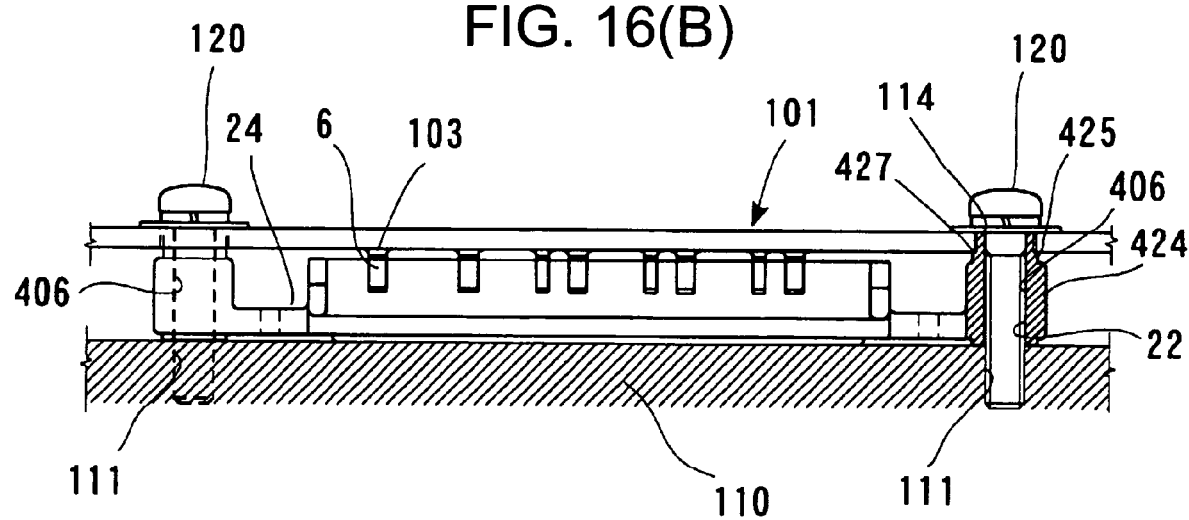
FIG. 16(B) is a cross sectional view showing a boss-shaped second fastener insertion hold and a fastener insertion hole formed through the second fastener insertion holder for fastening the power semiconductor module and the control circuit board to the cooling fin.

Alternatively, a boss-shaped fastener insertion holder 425 protruding from a fastener mounting plate 424 can be provided with a step 427, as shown in FIG. 16(B), such that the fastener insertion holder 425 is coupled and fixed to the control circuit board 101 at the height, at which the step 427 is formed. By setting the height of the step 427, the positional relation between the outer lead portions 6 and the control circuit board 101 can be adjusted, and further, a certain solder thickness can be secured in the reflow of the solder layers 103.

Figure 17A:
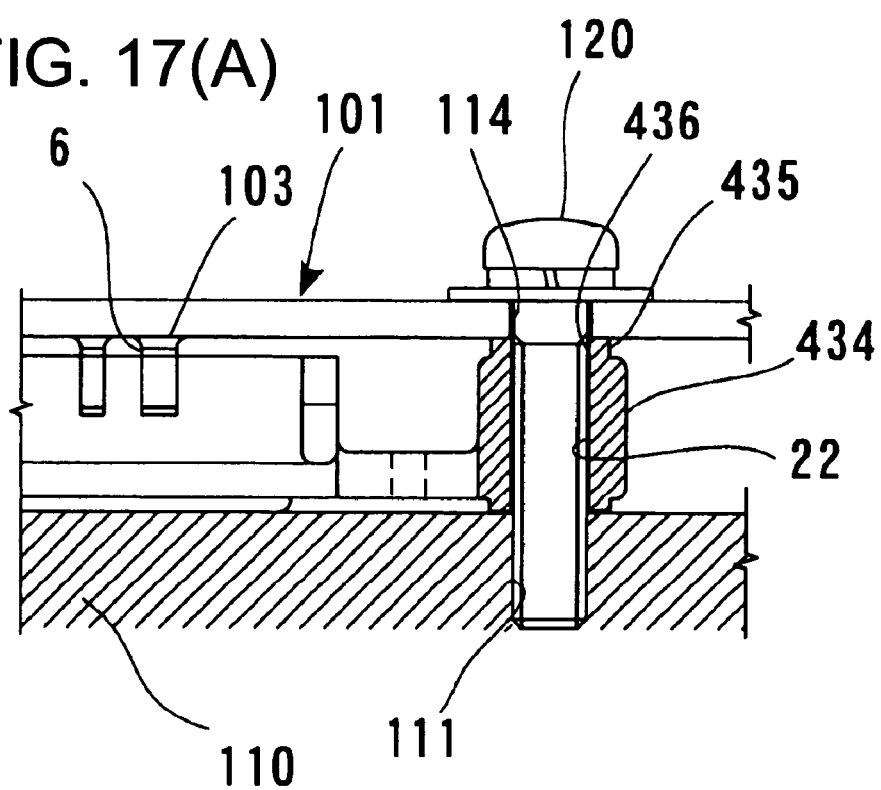
FIG. 17(A) is an expanded cross sectional view showing a boss-shaped third fastener insertion holder protruding upwardly from a fastener mounting plate.

Alternatively, a boss-shaped fastener insertion holder 435 protruding upwardly from a fastener mounting plate 434 can be disposed as shown in FIG. 17(A) such that the distal end of the fastener insertion holder 435 is coupled and fixed to the control circuit board 101. By setting the height of the fastener insertion holder 435, the positional relation between the outer lead portions 6 and the control circuit board 101 can be adjusted, and further, a certain solder thickness can be secured in the reflow of the solder layers 103. A fastener insertion hole 436 for securing the power semiconductor module and the control circuit board 101 to the cooling fin 110 can be formed through the fastener insertion holder 435. The fastener insertion hole 436 works also for the fastener insertion hole 22 described earlier. The power semiconductor module 1 and the control circuit board 101 can be fixed to the cooling fin 110 by securing the fastener 120 through the insertion hole 436 into the fastener hole 111 of the cooling fin 110.

Figure 17B:
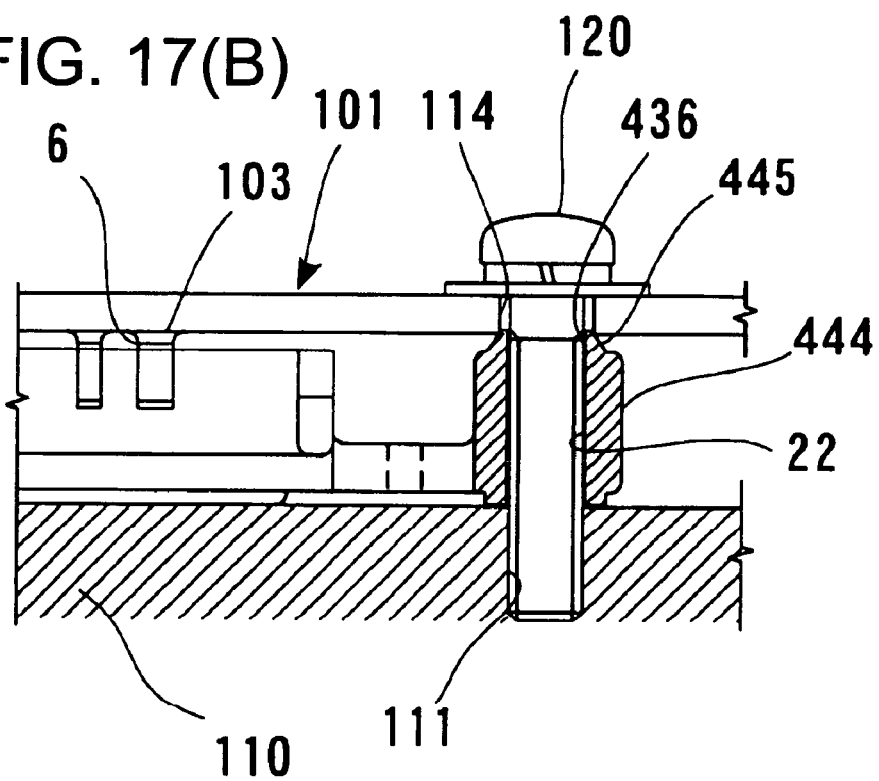
FIG. 17(B) is an expanded cross sectional view showing a boss-shaped fourth fastener insertion hold protruding upward from the fastener mounting plate.

Alternatively, a boss-shaped fastener insertion holder 445 tapered to the distal end thereof and protruding upwardly from a fastener mounting plate 444 is disposed as shown in FIG. 17(B) such that the fastener insertion holder 445 is coupled and fixed to the insertion hole 114 of the control circuit board 101 at a predetermined position on the taper thereof. By appropriately setting the height and the taper of the fastener insertion holder 445, the positional relation between the outer lead portions 6 and the control circuit board 101 can be adjusted, and further, a certain solder thickness can be secured in the reflow of the solder layers 103. A fastener insertion hole 436 for securing the power semiconductor module 1 and the control circuit board 101 to the cooling fin 110 is formed through the fastener insertion holder 445. The fastener insertion hole 436 works also for the fastener insertion hole 22 described earlier. The power semiconductor module 1 and the control circuit board 101 can be fixed to the cooling fin 110 by securing the fastener 120 through the insertion hole 436 into the fastener hole 111 of the cooling fin 110.

According to the present power module, the semiconductor chips 8 are surface-mounted on the insulating circuit board 7 and the lead frame 9 is surface-mounted on the semiconductor chips 8. Alternatively, the so-called insertion mount can be employed and the semiconductor chips 8 can be bonded to the insulating circuit board 7 and lead frame 9 by soldering. Brazing using a brazing filler metal including silver paste and such an electrically conductive adhesive other than the solder can be used alternatively.

The epoxy resin can be used for an insulating sealant. Alternatively, silicone gel and such a gel loading material can be injected into the terminal casing 2 and hardened therein with no problem. However, the epoxy resin is still preferable, since the epoxy resin exhibits excellent thermal conduction, excellent heat resistance, and high rigidity. When a gel loading material is used, it is necessary to press the upper surface thereof with a resin plate and to pay close precautions.

Although not described specifically in connection with the foregoing embodiments, it is preferable to equalize the thickness of the semiconductor chips 8 mounted on the insulating circuit board 7. By equalize the thickness of the semiconductor chips 8, the bend lengths of the lead frame 9 on the side of the inner leads 30 can be standardized. As a result, the press die used for forming the bend by pressing is manufactured easily.

Although not described specifically in connection with the foregoing embodiments, copper core balls or nickel core balls having a certain diameter (e.g. form several tens to several hundreds μ m in diameter) can be dispersed into the solder paste to secure a certain solder layer thickness in the reflow of the solder layers.

While the present invention has been particularly shown and described with reference to preferred embodiments thereof, it will be understood by those skilled in the art that the foregoing and other changes in form and details can be made therein without departing from the spirit and scope of the present invention. All modifications and equivalents, attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Application No. 2004-274427, filed on 22 Sep. 2004. The disclosure of the priority application, in its entirety, including the drawings, claims, and the specification thereof, are incorporated herein by reference.

What is claimed is:

1. A power semiconductor module for mounting on a control circuit board of a main apparatus, the power semiconductor module comprising:
   at least one power semiconductor chip;
   leads having outer lead portions for connecting to the control circuit board of the main apparatus and inner lead portions connected to the at least one semiconductor chip;
   a terminal casing housing part of the leads; and
   an insulating circuit board housed in the terminal casing,
   wherein one major surface of the insulating circuit board forms a radiator plane,
   wherein the at least one semiconductor chip is mounted on another major surface, on a side opposite to the radiator plane, of the insulating circuit board,
   wherein the inner lead portions are connected to the at least one semiconductor chip on the another major surface, on the side opposite to the radiator plane, of the insulating circuit board,
   wherein the terminal casing comprises a main body and a pair of fastener mounting plates extending in the opposite directions from the main body thereof to facilitate mounting of a cooling fin such that the radiator plane of the insulating circuit board is brought into contact with the cooling fin,
   wherein each of the fastener mounting plates includes a fastener insertion hole, through which a fastener is insertable,
   wherein the terminal casing is filled with a thermosetting resin that hardens for insulating sealing, and
   wherein the radiator plane of the insulating circuit board protrudes outwardly beyond a contact plane formed by the fastener mounting plates to enable the radiator plane of the insulating circuit board to make contact with the cooling fin.

2. The power semiconductor module according to claim 1, wherein the at least one semiconductor chip is surface-mounted on the insulating circuit board with a brazing or solder and the inner lead portions are surface-mounted on the at least one semiconductor chip with a brazing or solder.

3. The power semiconductor module according to claim 1, wherein slits are disposed in the thin portions of the fastener mounting plates.

4. The power semiconductor module according to claim 1, wherein each of the fastener mounting plates has a boss protruding therefrom.

5. The power semiconductor module according to claim 1, wherein the terminal casing comprises at least one protrusion protruding toward the insulating circuit board in bonding areas between the terminal casing and the insulating circuit board, to enable the thermosetting resin to flow around the at least one protrusion into a gap between the terminal casing and the insulating circuit board.

6. The power semiconductor module according to claim 1, wherein the terminal casing includes an adhesion strengthening structure that strengthens the adhesion of the thermosetting resin.

7. The power semiconductor module according to claim 1, wherein:
the outer lead portions are adapted to be surface-mounted on the control circuit board with a solder on the side opposite to the side of the radiator plane, and
at least one protrusion is formed at least on the surface that is adapted to face the control circuit board, of any of the terminal casing and the fastener mounting plates, to secure a predetermined solder thickness for soldering the outer lead portions to the control circuit board.

8. The power semiconductor module according to claim 1, wherein the outer lead portions are adapted to be surface-mounted on the control circuit board by soldering with a solder on the side opposite to the side of the radiator plane.

9. The power semiconductor module according to claim 1, wherein at least one power semiconductor chip comprises two or more semiconductor chips having an equal thickness are mounted on the insulating circuit board.

10. The power semiconductor module according to claim 1, wherein a fastener is insertable through the fastener insertion hole for fastening the power semiconductor module and the control circuit board to the cooling fin.

11. The power semiconductor module according to claim 2, wherein the inner portions of the lead frames soldered with a solder include protrusions that protrude toward the solder.

12. The power semiconductor module according to claim 2, wherein polyimide layers are formed on the at least one semiconductor chip except on electrodes thereof.

* * * * *